US010333528B1

(12) United States Patent
Patel et al.

(10) Patent No.: US 10,333,528 B1
(45) Date of Patent: Jun. 25, 2019

(54) POWER SUPPLY POWER MANAGEMENT

(71) Applicant: Apple Inc., Cupertino, CA (US)

(72) Inventors: Parin Patel, San Jose, CA (US); Jamie L. Langlinais, San Francisco, CA (US); Mark A. Yoshimoto, San Jose, CA (US); Rajarshi Paul, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/125,624

(22) Filed: Sep. 7, 2018

Related U.S. Application Data

(60) Provisional application No. 62/641,334, filed on Mar. 10, 2018.

(51) Int. Cl.
*H03L 7/085* (2006.01)
*H03L 7/099* (2006.01)

(52) U.S. Cl.
CPC .............. *H03L 7/085* (2013.01); *H03L 7/099* (2013.01)

(58) Field of Classification Search
None
See application file for complete search history.

(56) References Cited

U.S. PATENT DOCUMENTS

| 9,880,583 B2* | 1/2018 | Sheafor ............. G06F 1/06 |
| 2010/0007390 A1* | 1/2010 | Yeh ............. G06F 1/08 |
| | | 327/158 |
| 2011/0169536 A1* | 7/2011 | Friddell ............. G06F 1/3203 |
| | | 327/156 |
| 2013/0129114 A1* | 5/2013 | Lesso ............. H03L 7/08 |
| | | 381/98 |
| 2018/0083643 A1* | 3/2018 | Zerbe ............. H03L 7/099 |

OTHER PUBLICATIONS

Rao, R., et al., "Performance Optimal Processor Throttling Under Thermal Constraints," CASES' 07, Sep. 30-Oct. 3, 2007, Salzburg, Austria, pp. 257-266.
"*Dynamic Frequency Scaling*," Wikipedia, [online], [retrieved on Sep. 12, 2018]. Retrieved from the Internet <URL: https://en.wikipedia.org/wiki/Dynamic_frequency_scaling> 3 pages.

\* cited by examiner

*Primary Examiner* — Lincoln D Donovan
*Assistant Examiner* — Khareem E Almo
(74) *Attorney, Agent, or Firm* — Kilpatrick Townsend & Stockton, LLP

(57) ABSTRACT

Power supply topologies can leverage relatively smaller component sizes while meeting the power requirements of loads. In a first stage, a determination is made as to whether a high current limit is exceeded for a first duration, or whether an average current provided exceeds an average current limit, such that a power supply component (e.g., inductor) is thermally stressed. In either event, a clock frequency is reduced by a first factor. In a second stage, a determination is made as to whether an output voltage drops below a voltage threshold. If so, the clock frequency may be further reduced by a second factor.

20 Claims, 23 Drawing Sheets

POWER SUPPLY POWER MANAGEMENT

CROSS-REFERENCES TO RELATED APPLICATIONS

This application is a nonprovisional of U.S. provisional patent application No. 62/641,334, filed Mar. 10, 2018, which are incorporated by reference.

BACKGROUND

Battery powered electronic devices may include rechargeable batteries. These electronic devices may also include power management circuitry that manages an internal power supply that powers circuitry of the electronic device.

Power management circuits may include or drive power supply switches, inductors, and other components. Conventionally, these components are sized to be able to handle a peak or maximum amount of current drawn by the circuitry of the electronic device. As such, the selected components may be relatively large and may compete for space in the electronic devices. These larger components may also be less power efficient.

SUMMARY

Embodiments of the present invention provide circuits, methods, and apparatus that promote use of more space and energy efficient power supply components, while meeting the power requirements of modern electronic devices. In some embodiments, an output voltage provided by power management circuitry may initially provide a current with a high current limit to a load circuit. As long as this high current limit is not exceeded, the frequency of a clock provided to the load circuit may be maintained at an initial frequency. Once the high current limit is exceeded, the load regulation of the output voltage may be compromised. This may lead to a reduction in output voltage, which may be referred to as a droop in the output voltage. To avoid this, in response to the excess current, a first stage of performance management may be invoked by the power management circuitry. For example, the frequency of the clock provided to the load circuit may be reduced from the initial frequency to a first reduced frequency. Also, the load current may be managed by lowering the current limit to a low current limit. The result of these actions may be improved load regulation and a reduction in the droop of the output voltage. The current detection and frequency reduction may be controlled using a fast control loop, examples of which are shown below. In some circumstances, excess current may continue to be drawn. This may continue to comprise the output voltage load regulation, again leading to a reduction or droop in the output voltage. At such time, a second stage of performance management may be employed by the power management circuitry. For example, the output voltage may be compared to a voltage threshold. If the output voltage drops below the voltage threshold, the clock frequency may be reduced further from the first reduced frequency to a second reduced frequency. This may help to maintain the absolute voltage droop within a power management criterion. The clock frequency may return from the second reduced frequency to the first reduced frequency when one or more conditions are met. In this and other embodiments of the present invention, the clock frequency may return to the first reduced frequency when the output voltage is above the voltage threshold for a first duration, when the output voltage exceeds the voltage threshold by a first margin, or when other conditions or combinations of conditions are met. The clock frequency may return from the first reduced frequency to its initial frequency and the current limit may return to the high current limit when the current is below the low current limit, when the current is below the low current limit for a second duration, or when other conditions or combinations of conditions are met.

In these and other embodiments of the present invention, the first stage of performance management may be current sense based. For example, it may use a current limit or equivalent detection to determine when the output voltage may begin to operate as a current source, which has a poor load regulation, instead of a voltage source. In these and other embodiments of the present invention, the second stage of performance management may be voltage based.

In some embodiments, an output voltage provided by power management circuitry may initially provide a current with an average current limit to a load circuit. The average of the current provided to the load circuit may then be compared to the average current limit. As long as the average current does not exceed the average current limit, the frequency of a clock provided to the load circuit may be maintained at an initial frequency. Once the average current limit is exceeded, a first stage of performance management may be invoked by the power management circuitry, and the clock frequency may be reduced to a first reduced frequency. In some circumstances, this first stage of performance management may be insufficient and a second stage of performance management may be employed by the power management circuitry. In this case, the output voltage may then be compared to a voltage threshold. If the output voltage drops below the voltage threshold, the clock frequency may be further reduced from the first reduced frequency to a second reduced frequency. The clock frequency may return from the second reduced frequency to the first reduced frequency when one or more conditions are met. In this and other embodiments of the present invention, the clock frequency may return to the first reduced frequency when the output voltage is above the voltage threshold for a first duration, when the output voltage exceeds the voltage threshold by a first margin, or when other conditions or combinations of conditions are met. The clock frequency may return from the first reduced frequency to its initial frequency when the average current is below the average current limit, when the average current is below the average current limit for a second duration, or when other conditions or combinations of conditions are met.

The average current limit detection employed by these and other embodiments of the present invention may be another method of detecting over-current being consumed by a load circuit. The average current limit may be used in conjunction with, or without, the absolute current limit based fast detection method described herein. The average current limit detection may improve thermal protection of the components of the power management circuitry and may also allow adaptive current limit management. The absolute current limit detection may protect the load regulation of the output voltage thereby reducing the droop of the output voltage. These and other embodiments of the present invention may employ adaptive current limit management where the current limit may be initially allowed a higher limit for a fixed timer or for a detection window. The current limit may then be reduced to a lower limit to meet DC saturation limit and or the thermal limit of the inductors. This may also help to improve the reliability of an integrated circuit on which the power management circuitry may be included.

In some embodiments, an output voltage provided by power management circuitry may initially provide a current with a high current limit to a load circuit. So long as this high current limit is not exceeded, the frequency of a clock provided to the load circuit may be maintained at an initial frequency. Once the high current limit is exceeded for a first duration, a first stage of performance management may be invoked by the power management circuitry, wherein the current limit may be reduced from the high current limit to a low current limit and the clock frequency may be reduced from the initial frequency to a first reduced frequency. In some circumstances, this first stage of performance management may be insufficient and a second stage of performance management may be employed by the power management circuitry. In this case, the output voltage may then be compared to a voltage threshold. If the output voltage drops below the voltage threshold, the clock frequency may be further reduced from the first reduced frequency to a second reduced frequency. The clock frequency may return from the second reduced frequency to the first reduced frequency when one or more conditions are met. In this and other embodiments of the present invention, the clock frequency may return to the first reduced frequency when the output voltage is above the voltage threshold for a second duration, when the output voltage exceeds the voltage threshold by a first margin, or when other conditions or combinations of conditions are met. The clock frequency may return from the first reduced frequency to its initial frequency when the current is below the low current limit, when the current is below the low current limit for a third duration, or when other conditions or combinations of conditions are met.

Again, in some embodiments, the above-discussed techniques may be combined. For instance, an output voltage provided by power management circuitry may initially provide a current with a high current limit to a load circuit. When the high current limit is exceeded for a first duration, a first stage of performance management may be invoked by the power management circuitry, wherein the current limit may be changed to a low current limit and the frequency of the clock provide to the load circuit may be reduced from an initial frequency to a first reduced frequency. In parallel, an average current may be compared to an average current limit. When the average current limit is exceed, the first stage of performance management may again be invoked by the power management circuitry and the frequency of the clock provided to the load circuit may be reduced from the initial frequency to the first reduced frequency. After either of these events, further increases in current may cause a second stage of performance management may be employed by the power management circuitry, wherein the output voltage may be compared to a voltage threshold. If the output voltage drops below the voltage threshold, the clock frequency may be reduced further to a second reduced frequency. The clock frequency may return from the second reduced frequency to the first reduced frequency when one or more conditions are met. In this and other embodiments of the present invention, the clock frequency may return to the first reduced frequency when the output voltage is above the voltage threshold for a second duration, when the output voltage exceeds the voltage threshold by a first margin, or when other conditions or combinations of conditions are met. The clock frequency may return from the first reduced frequency to its initial frequency in a manner that corresponds to the previous frequency reduction. For example, when the clock frequency is lowered due to excessive average current, the clock frequency may be increased when the average current is below the average current limit, when the average current is below the average current limit for a third duration, or when other conditions or combinations of conditions are met. When the clock frequency is lowered due to excessive current, the clock frequency may be increased when the current is below the low current limit, when the current is below the low current limit for a fourth duration, or when other conditions or combinations of conditions are met.

In the above examples, an initial clock frequency may be a high frequency and the clock frequency may be reduced due to excess current and low voltage conditions. In these and other embodiments of the present invention, an initial clock frequency may be increased due to various conditions. For example, a circuit may be operable in a low-power configuration that may allow an increase in clock frequency from an initial frequency.

These and other embodiments of the present invention may provide power management circuitry that may be located in various types of devices, such as portable computing devices, tablet computers, desktop computers, laptops, all-in-one computers, cellular phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

Figure 1:
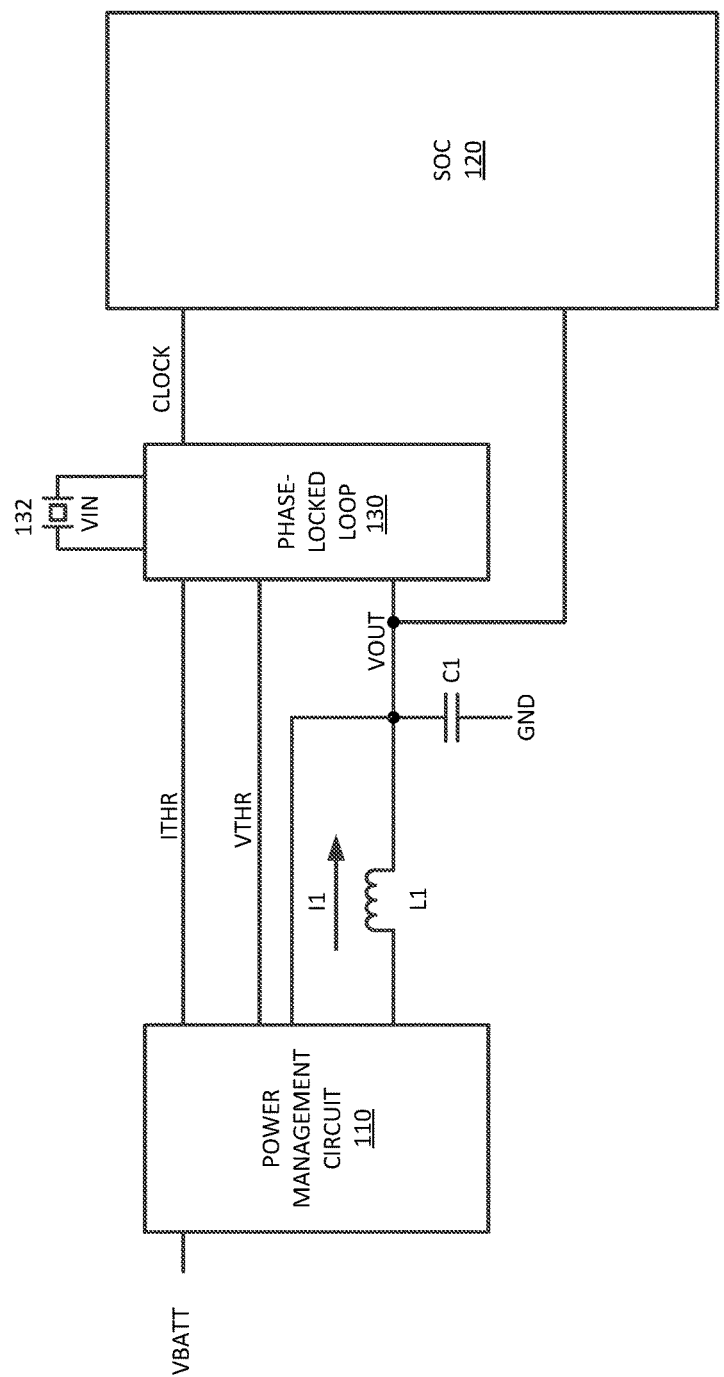
FIG. 1 illustrates a portion of an electronic device according to an embodiment of the present invention.

FIG. 1 illustrates a portion of an electronic device according to an embodiment of the present invention. This figure, as with the other included figures, is shown for illustrative purposes and does not limit either the possible embodiments of the present invention or the claims.

This figure illustrates a power management circuit 110 driving a phase-locked loop 130, which may provide a clock signal to system-on-a-chip (SOC) 120. Power management circuit 110 may provide a power supply voltage VOUT to phase-locked loop 130. Power management circuit 110 may generate current I1 through inductor L1 to generate power supply voltage VOUT. The power supply voltage VOUT may be filtered by capacitor C1. VOUT may provide power to phase-locked loop 130 and the system-on-a-chip 120. In these and other embodiments of the present invention, phase-locked loop 130 may be included in the system-on-a-chip 120.

Phase-locked loop 130 may receive a periodic input signal VIN from crystal 132. Phase-locked loop 130 may divide the frequency of the signal VIN and provide an output clock signal to the system-on-a-chip 120. Power management circuit 110 may detect undesirable power supply currents and voltages and may vary the frequency of the clock signal accordingly. In this example, power management circuit 110 may provide signals ITHR and VTHR to phase-locked loop 130. Each of these signals may reduce a frequency of the clock signal provided by phase-locked loop 130.

In these and other embodiments of the present invention, various undesirable power supply currents and voltages may be detected by power management circuit 110. For example, power management circuit 110 may detect that an excess amount of current is being drawn by system-on-a-chip 120. Since the current drawn by system-on-a-chip 120 is at least roughly proportional to the clock frequency, power management circuit 110 may assert the ITHR signal to instruct phase-locked loop 130 to reduce the frequency of the clock signal. In these and other embodiments of the present invention, power management circuit 110 may determine that an average current provided to the system-on-a-chip 120 is excessive in that it exceeds a threshold average value. Again, power management circuit 110 may assert the ITHR signal to instruct phase-locked loop 130 to reduce the frequency of the clock signal. In these and other embodiments of the present invention, power management circuit 110 may detect that the output power supply VOUT is below a first specified threshold, and in response may again assert the ITHR signal to instruct phase-locked loop 130 to reduce the frequency of the clock signal. In these and other embodiments of the present invention, one or more of these detections may be done in parallel or series by power management circuit 110.

In these and other embodiments of the present invention, this first stage of performance management, an initial reduction in clock frequency, may not be sufficient, and an additional level of performance management, a second reduction in clock frequency, may be invoked. For example, power management circuit 110 may determine that the output power supply VOUT is below a second specified threshold even though the clock frequency has already been reduced in response to one of the above events. In such a case, power management circuit 110 may assert the VTHR signal to instruct phase-locked loop 130 to further reduce the frequency of the clock signal.

In these and other embodiments of the present invention, an amount that a clock frequency may be reduced may vary. For example, a first reduction in frequency may be on the order of 20 percent. This reduction may be 10, 20, 30, 40, 50, 75, 80 percent, or other percentage or range of percentages. The second reduction in frequency may be greater, lesser, or the same. For example, the clock frequency may further be divided by a factor of four. This reduction may be a factor of less than two, two, three, four, five, more than five, or other factor.

Power management circuit 110, phase-locked loop 130, and system-on-a-chip 120 may be located in various types of electronic devices such as portable computing devices, tablet computers, desktop computers, laptops, all-in-one computers, cell phones, smart phones, media phones, storage devices, portable media players, navigation systems, monitors, power supplies, adapters, remote control devices, chargers, and other devices. Power management circuit 110 may provide an output voltage using a buck converter, boost converter, or other type of voltage converter. System-on-a-chip 120 may include one or more processing circuits, graphics processors, and other types of circuits.

Again, under some conditions, system-on-a-chip 120 may begin to draw excessive current. This excessive current may cause heating in inductors L1 or other components that may damage the circuitry of the electronic device. This excessive current may also cause the output voltage VOUT to drop. This drop in voltage may prevent the system-on-a-chip 120 from operating properly and may cause crashes or other undesirable conditions. This excessive current may be caused by corrupted, improperly designed, or otherwise undesirable programs running on the system-on-a-chip 120.

Accordingly, these and other embodiments of the present invention may detect these excessive current and low-voltage conditions and compensate using the frequency of the clock provided by phase-locked loop 130 accordingly. This reduction in clock frequency may reduce the current required by power management circuit 110, thereby reducing component heating and protecting the electronic device. In these and other embodiments of the present invention, a high current may be allowed for a short period of time. This may allow a circuit to operate in bursts without overheating power supply components. The current limits and durations set in a first stage of performance management in these examples may be varied in different circuits to avoid these overheating and damaging conditions. A voltage threshold may be set in a second stage of performance management to be below what is necessary to operate the circuitry at the initial clock frequency but above what is needed to operate the circuitry at the first reduced clock frequency. An example is shown in the following figure.

Figure 2:
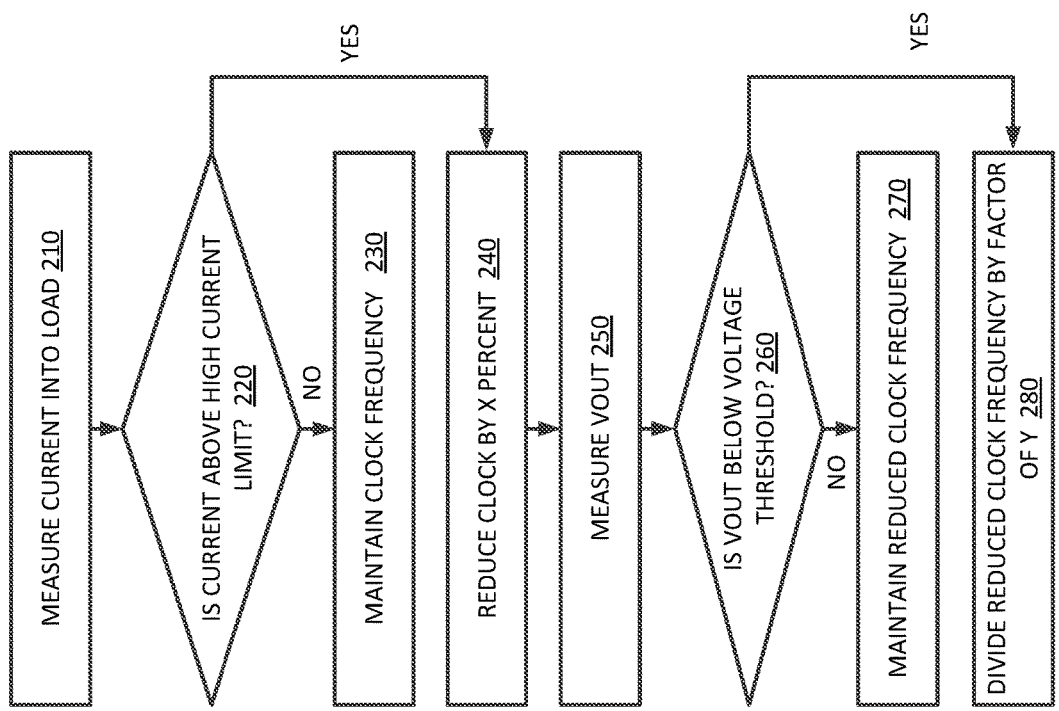
FIG. 2 is a flowchart of a method of managing power according to an embodiment of the present invention.

FIG. 2 is a flowchart of a method of managing power according to an embodiment of the present invention. In act 210, a current into a load, for example through a power supply inductor, such as inductor L1 in FIG. 1, may be measured. In act 220, it may be determined whether this current is above a high current limit. If the measured current is not above the low current limit, the clock frequency may be maintained in act 230. If the current is above the high current limit, then the clock frequency may be reduced by X percent in act 240. Again, X may be 10, 20, 30, 40, 50, 75, 80 percent or other percentage or range of percentages. At this time, the current limit may be reduced as well from the high current limit to a low current limit.

Once this clock frequency has been reduced from an initial frequency to a first reduced frequency, the power supply output voltage VOUT may be measured in act 250 and compared to a voltage threshold in act 260. If the output voltage is above the voltage threshold, the clock frequency may be maintained in act 270. If the power supply output voltage falls below the voltage threshold, then the clock frequency may be divided by a factor of Y in act 280 to a second reduced frequency. Again, the factor Y may be a factor of less than two, two, three, four, five, more than five, or other factor.

In these and other embodiments of the present invention, the low frequency clock states may be exited in various ways. For example, the clock frequency may be increased from the second (lowest) reduced frequency to the first reduced frequency when the output voltage is above the voltage threshold by a specific margin (which may be determined using a hysteresis comparator), when the output voltage is above the voltage threshold for a first duration, or when another condition or combination of conditions is met. The clock frequency may be increased from the first reduced frequency to the initial frequency when the drawn current is below the low current limit, when the current is below the low current limit for a second duration, or when another condition or combination of conditions is met.

In this and the other examples herein, the measurements of current and voltages may or may not include an actual quantification. Instead, in this and the other examples, the load current, or portion thereof, may be mirrored. The mirrored current may flow through an impedance to generate a voltage. This voltage may then be compared to a reference. Similarly, the output voltage may be compared to a reference voltage without an actual quantification being performed. A simplified circuit that may be used in implementing this flowchart is shown in the following figure.

Figure 3:
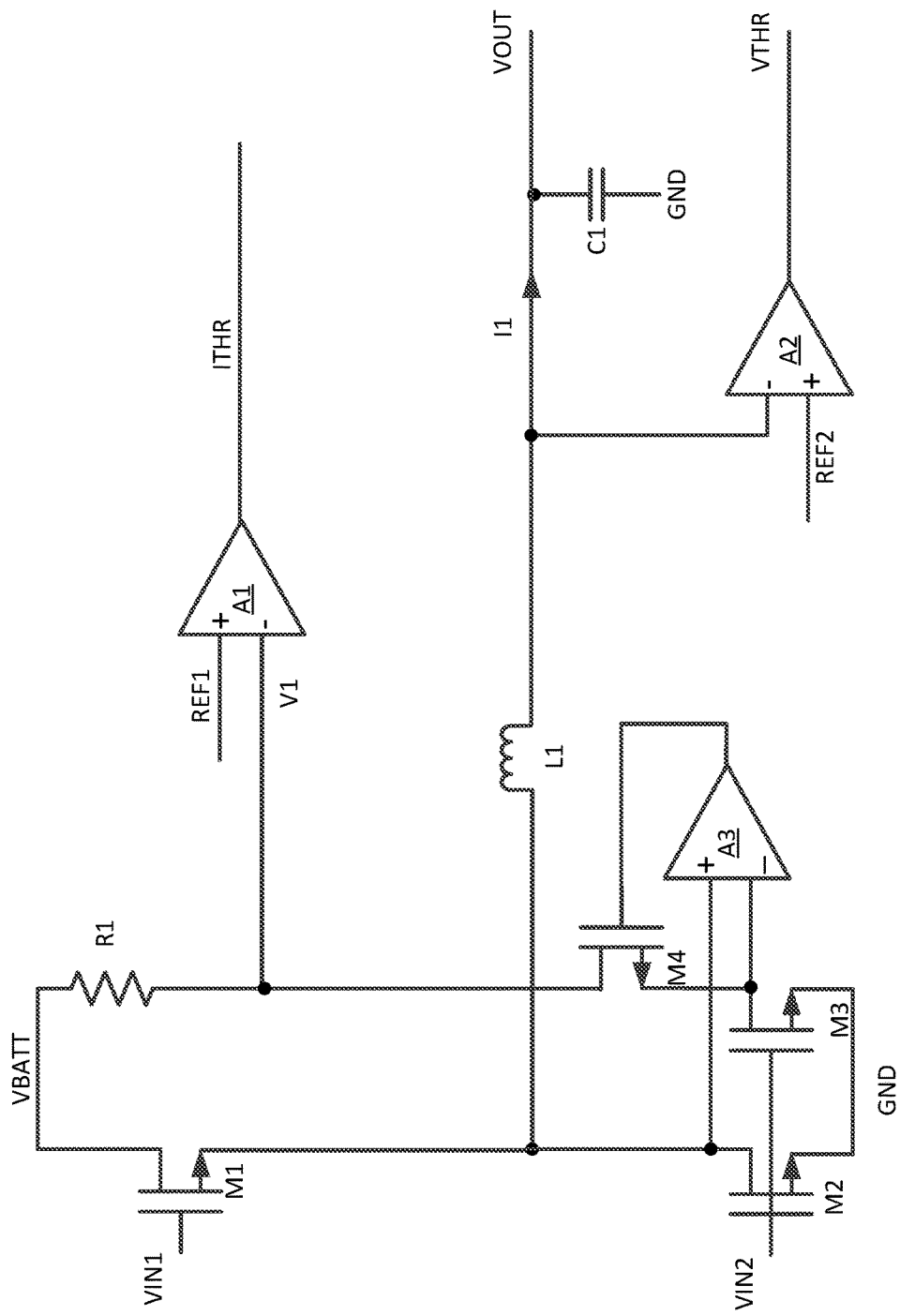
FIG. 3 illustrates a portion of a power management circuit according to an embodiment of the present invention.

FIG. 3 illustrates a portion of a power management circuit according to an embodiment of the present invention. In this example, transistors M1 and M2 may be an output stage of a buck converter or other type of switching power supply. The input signals VIN1 and VIN2 may be non-overlapping pulse-width modulated signals that generate current I1 through inductor L1 to provide the output power supply VOUT for a load, such as system-on-a-chip 120 shown in FIG. 1. In this example, one inductor L1 driven by one output stage is shown, though in these and other embodiments of the present invention, more than one inductor and output stage may be utilized.

This circuit may also measure the current I1 provided to the load. In these and other embodiments of the present invention, the measurement may be direct or indirect. In this example, an indirect measurement of I1 may be made. Specifically, transistor M3 may have its gate and source coupled to the gate and source of transistor M2 to form a current mirror. Amplifier A3 may drive transistor M4 such that the voltage at the inverting input of the amplifier is equal to the drain voltage of M2. In this way, the operating conditions of M2 and M3 may match. The resulting current through R1 may be proportional to current I1. (Transistors M2 and M3 may be scaled to each other, for example by forming transistor M2 from multiple versions of transistor M3.) The resulting voltage across R1 may be compared to a reference voltage REF1 using comparator or amplifier A1. When current I1 is above a current limit and excessive, comparator A1 may provide a low signal on ITHR. This low signal may be received by phase-locked loop 130 as shown in FIG. 1. This low signal may cause phase-locked loop 130 to reduce the frequency of the clock signal provided to system-on-a-chip 120. In turn, this reduction in frequency may reduce the current I1. Again, the current limit may be reduced as well. In this example, a reduction in the current limit would mean that REF1 is increased in voltage.

Once the frequency of the clock signal provided by phase-locked loop 130 is reduced, the operating voltage required by system-on-a-chip 120 may be reduced. Accordingly, power management circuit 110 may include comparator A2. Comparator A2 may compare the power supply output voltage VOUT to a second reference voltage REF2. When the power supply output voltage VOUT falls below be REF2, comparator A2 may provide a low level on output signal VTHR. This low level may be received by phase-locked loop 130, which may further reduce the frequency of the clock signal provided by system-on-a-chip 120.

In these and other embodiments of the present invention, power management circuit 110 may measure the output current I1 provided to system-on-a-chip 120 in various ways. An example is shown in the following figures.

Figure 4:
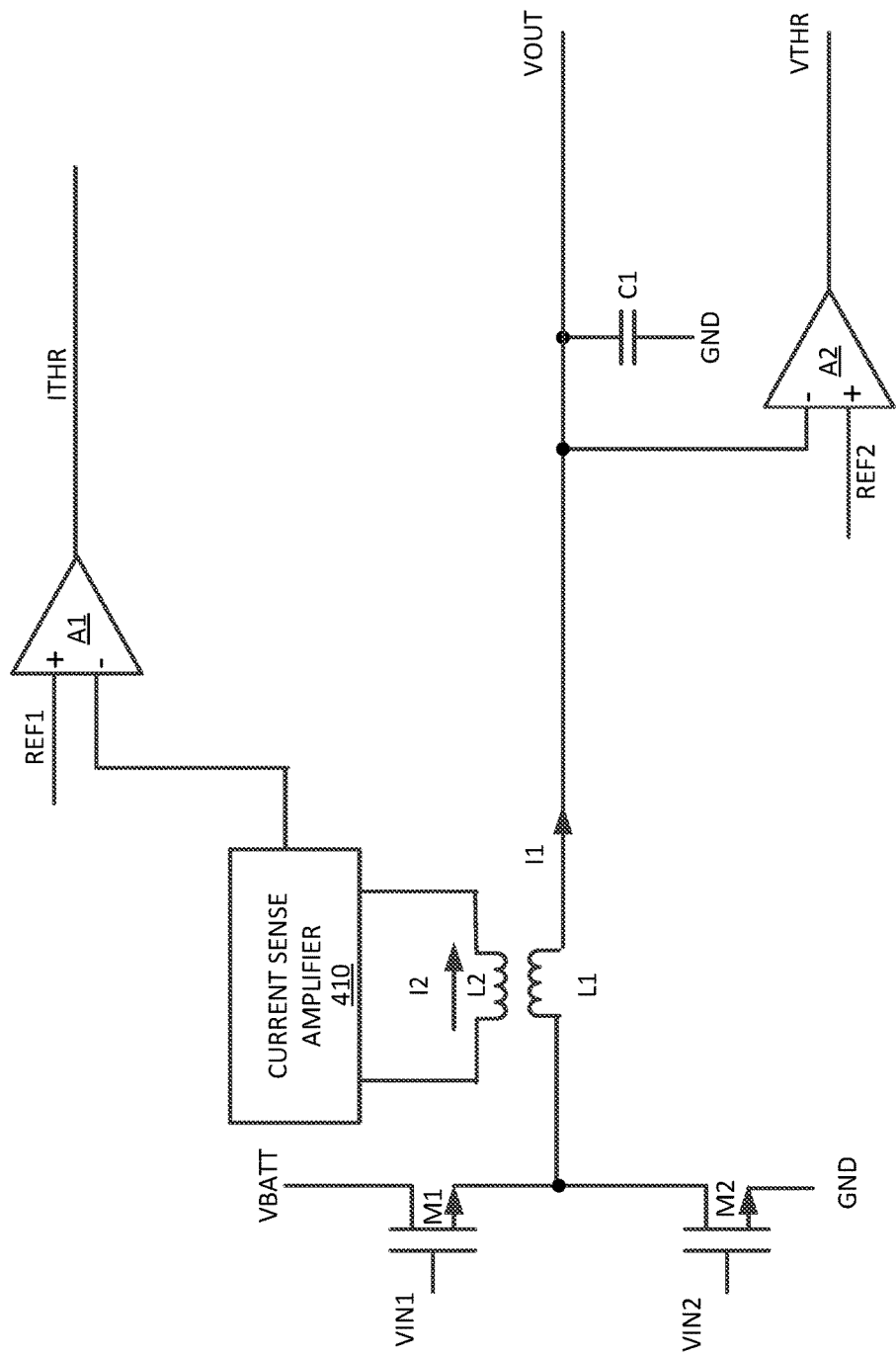
FIG. 4 illustrates a portion of a power management circuit according to an embodiment of the present invention.

FIG. 4 illustrates a portion of a power management circuit according to an embodiment of the present invention. Inductor L2 may be coupled to inductor L1 to form a current transformer. The induced current I2 may be proportional to current I1. The current I2 may be sensed by current sense amplifier 410 to generate an output voltage. This output voltage may be compared to a reference REF1 using comparator A1. When the current is excessive, comparator A1 may provide a low signal on ITHR. This low signal may be received by phase-locked loop 130 as shown in FIG. 1. This low signal may cause phase-locked loop 130 to reduce the frequency of the clock signal provided to system-on-a-chip 120. In turn, this reduction in clock frequency may reduce the current I1.

Figure 5:
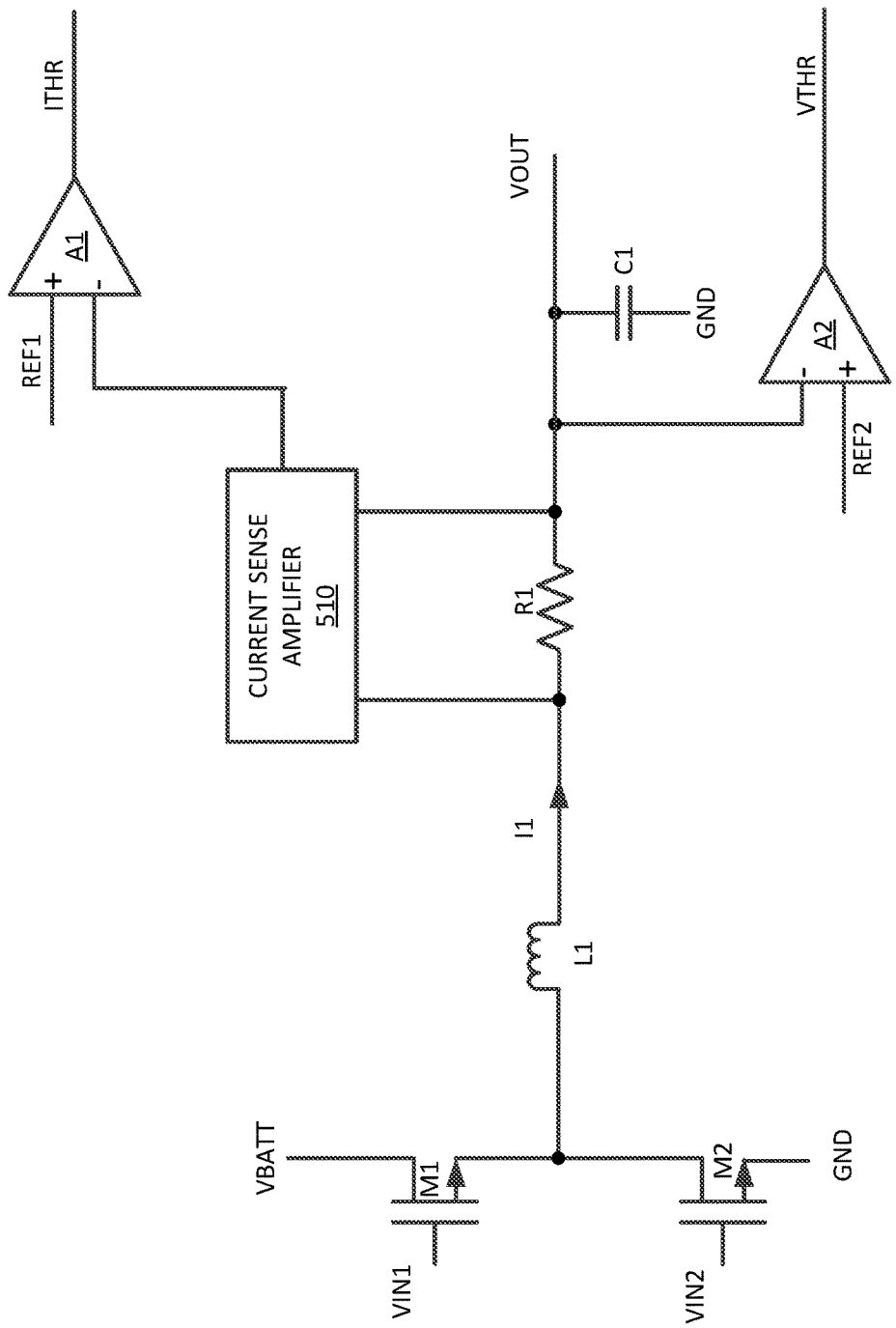
FIG. 5 illustrates a portion of a power management circuit according to an embodiment of the present invention.

FIG. 5 illustrates a portion of a power management circuit according to an embodiment of the present invention. In this example, a more direct measurement of I1 may be made. R1 may be placed in series with inductor L1. The resulting voltage across resistor R1 may be sensed by current sense amplifier 510. Current sense amplifier 510 may provide an output signal to comparator 320 as before.

In these and other embodiments of the present invention, various circuits may be used to implement phase-locked loop 130. An example is shown in the following figure.

Figure 6:
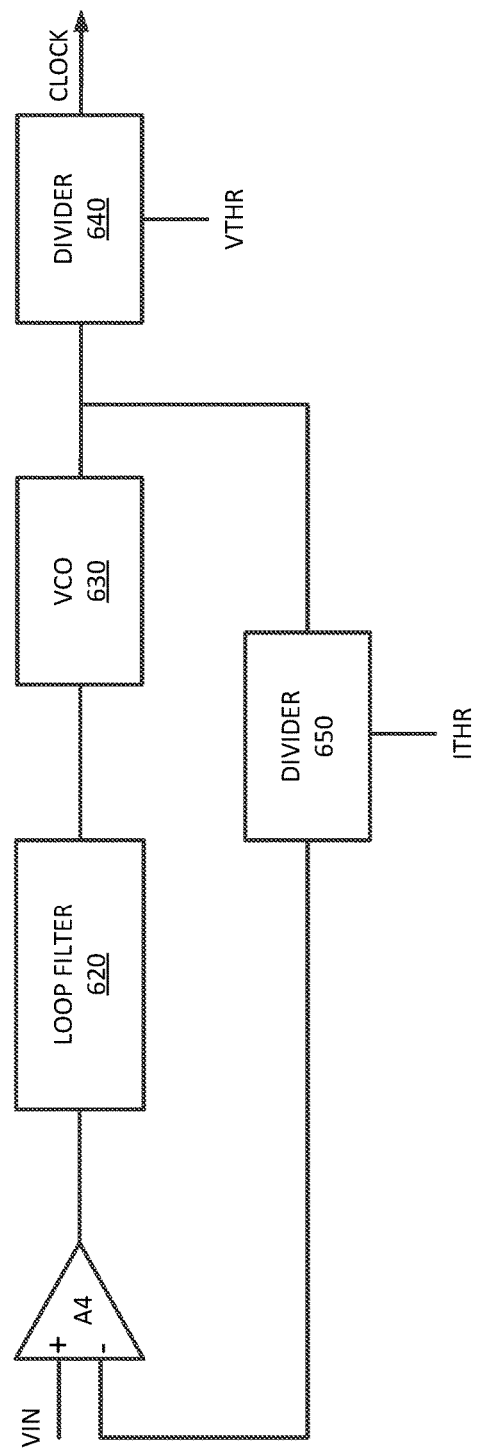
FIG. 6 illustrates a phase-locked loop that may be used with a power management circuit according to an embodiment of the present invention.

FIG. 6 illustrates a phase-locked loop that may be used with a power management circuit according to an embodiment of the present invention. In this example, a clock signal VIN may be received from crystal 132 as shown in FIG. 1. The input signal VIN may be received by comparator 610, an output of which may be filtered by loop filter 620. Loop filter 620 may drive voltage-controlled oscillator 630. The output of voltage-controlled oscillator 630 may be divided by divider 650 and provided back to comparator 610. The signal ITHR may be received by divider 650. When the signal ITHR is active, it may increase the amount that divider 650 divides the frequency of the output signal provided by voltage-controlled oscillator 630. For example, divider 650 may ordinarily divide frequency of the signal provided by voltage-controlled oscillator 630 by a factor of four. When ITHR is active, this division may be increased to a factor of five. In this way, the overall frequency of the clock signal may be reduced by 20 percent. In these and other embodiments of the present invention, the signal ITHR may cause other changes to the frequency of the clock signal. The output of voltage-controlled oscillator 630 may be divided by divider 640. Divider 640 may divide the frequency of the signal provided by voltage-controlled oscillator 630 by a factor of one, less than two, two, three, four, five, more than five, or other factor. For example, when the VTHR is active, divider 640 may divide the frequency of the output signal provided by voltage-controlled oscillator 630 by a factor of four, while when signal VTHR is inactive, divider 640 may divide the frequency of this signal by one. Divider 640 may provide a clock signal to system-on-a-chip 120 (shown in FIG. 1.)

Figure 7:
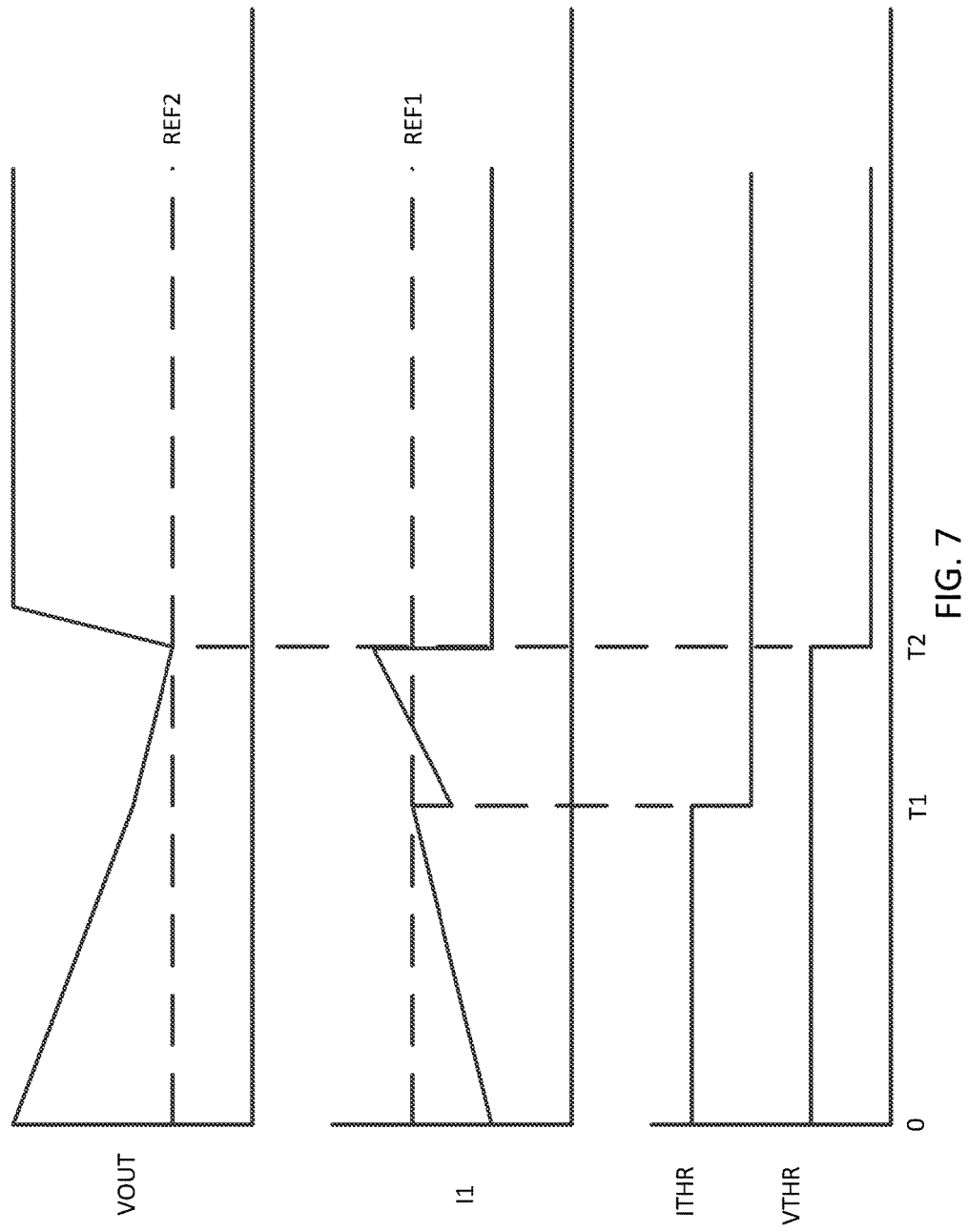
FIG. 7 is a timing diagram of a power management circuit according to an embodiment of the present invention.

FIG. 7 is a timing diagram of a power management circuit according to an embodiment of the present invention. In this example, I1 may increase progressively until it reaches a reference voltage REF1 at time T1. At this time, comparator A1 (shown in FIG. 3) may change state, and ITHR may go low. This may reduce a clock frequency by a specific percent. In this example, the output current I1 may continue to increase. This may in turn cause the output voltage VOUT to reach a second reference voltage REF2. As this occurs, comparator A2 (shown in FIG. 3) may drive output signal VTHR low, which may reduce the clock frequency even further. This may reduce I1 and allow VOUT to return to a higher level.

Figure 8:
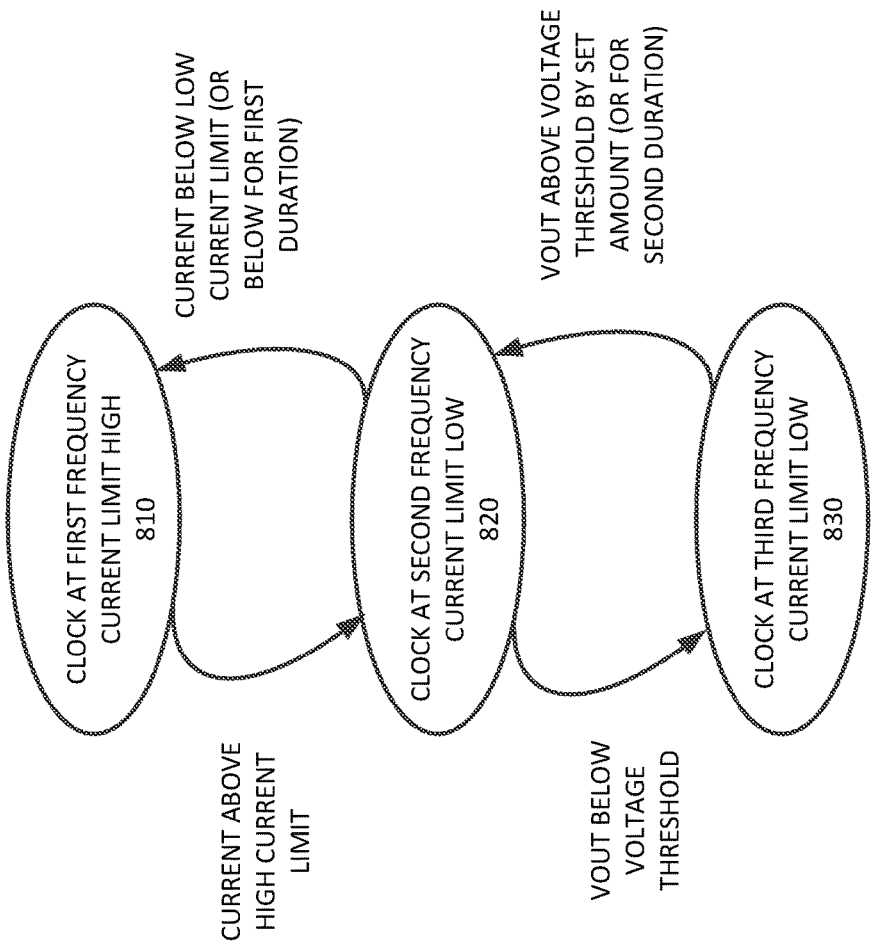
FIG. 8 is a state diagram showing the operation of a power management circuit according to an embodiment of the present invention.

FIG. 8 is a state diagram showing the operation of a power management circuit according to an embodiment of the present invention. Initially, a power management circuit may be in state 810 with the clock at the first or initial frequency and a current at a high current limit. When the current exceeds the high current limit, the power management circuit may enter state 820. At this time, the clock may be reduced to a first reduced frequency and the current limit may be set to a low current limit. The power management circuit may return to state 810 when the current falls below the low current limit, when the current falls below the low current limit for a first duration, or when another condition or combination of conditions are met. From state 820, the power management circuit may go to state 830 when the output voltage falls below a voltage threshold. In state 830, the clock may be reduced further to a second reduced frequency and the current limit may remain at the low current limit. The power management circuit may return to state 820 when the output voltage is above the voltage threshold, for example by a set amount, for a second duration, or when other conditions or combination of conditions are met.

In various embodiments of the present invention, a current provided by a power management circuit may include noise spikes and other artifacts. These artifacts may cause undesirable changes in the state of ITHR and unnecessary reductions in a clock frequency provided by phase-locked loop 130. Accordingly, embodiments of the present invention may filter the sense current to generate a resulting average current, which may be compared to an average current limit. An example is shown in the following figure.

Figure 9:
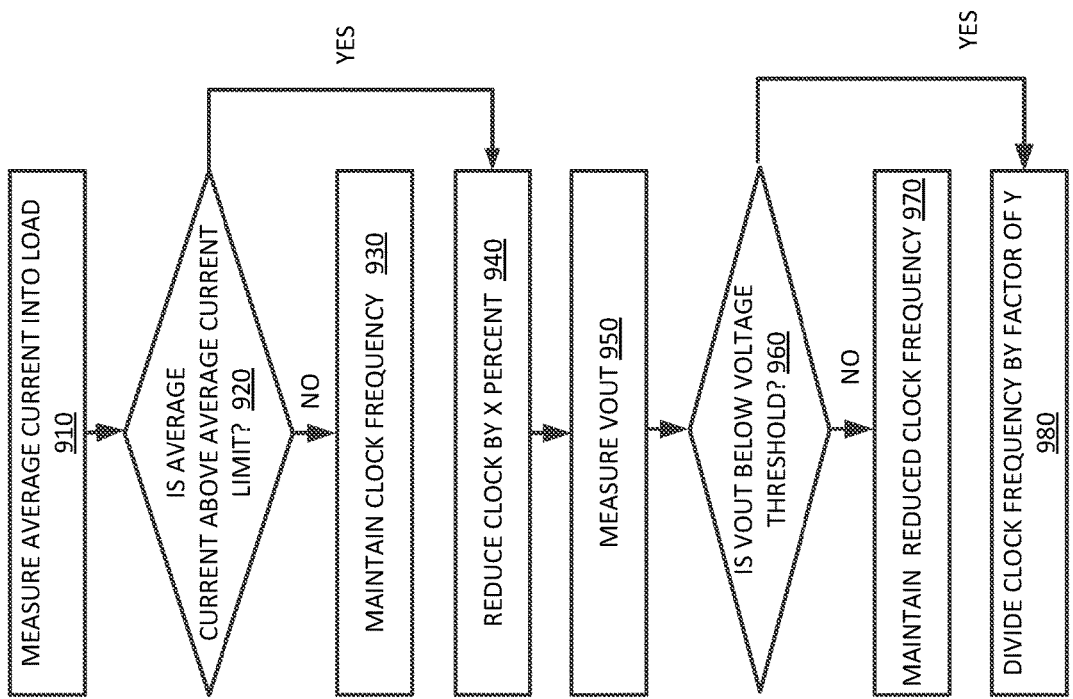
FIG. 9 is a flowchart of a method of managing power according to an embodiment of the present invention.

FIG. 9 illustrates a flowchart of a method of managing power according to an embodiment of the present invention. In act 910, an average load current, for example the average current through a power supply inductor, such as inductor L1 in FIG. 1, may be measured. For example, a current proportional to the load current may be filtered or otherwise averaged. The time constant for this filtering may be on the order of 5 to 10 us, 10 to 100 us, or more than 100 us. In act 920, it may be determined whether the average current is above an average current limit. If the average current is not above the average current limit, the clock frequency may be maintained at an initial frequency in act 930. If the average current is above the average current limit, then the clock frequency may be reduced by X percent in act 940. Again, X may be 10, 20, 30, 40, 50, 75, 80 percent or other percentage or range of percentages.

Once this clock frequency has been reduced to a first reduced frequency, the power supply output voltage VOUT may be measured in act 950 and compared to a voltage threshold in act 960. If the output is above the voltage threshold, the clock frequency may be maintained at the first reduced frequency in act 970. If the power supply output voltage falls below the voltage threshold, then the clock frequency may be divided by a factor of Y in act 980 to a second reduced frequency. Again, the factor Y may be a factor of less than two, two, three, four, five, more than five, or other factor.

In these and other embodiments of the present invention, the low frequency clock states may be exited in various ways. For example, the clock frequency may be increased from the second (lowest) reduced frequency to the first reduced frequency when the output voltage is above the voltage threshold by a specific margin (which may be determined using a hysteresis comparator), when the output voltage is above the voltage threshold for a first duration, or when another condition or combination of conditions is met. The clock frequency may be increased from the first reduced frequency to the initial frequency when the average current is below the average current limit, when the average current is below the average current limit for a second duration, or when another condition or combination of conditions are met. A simplified circuit that may be used in implementing this flowchart is shown in the following figure.

Figure 10:
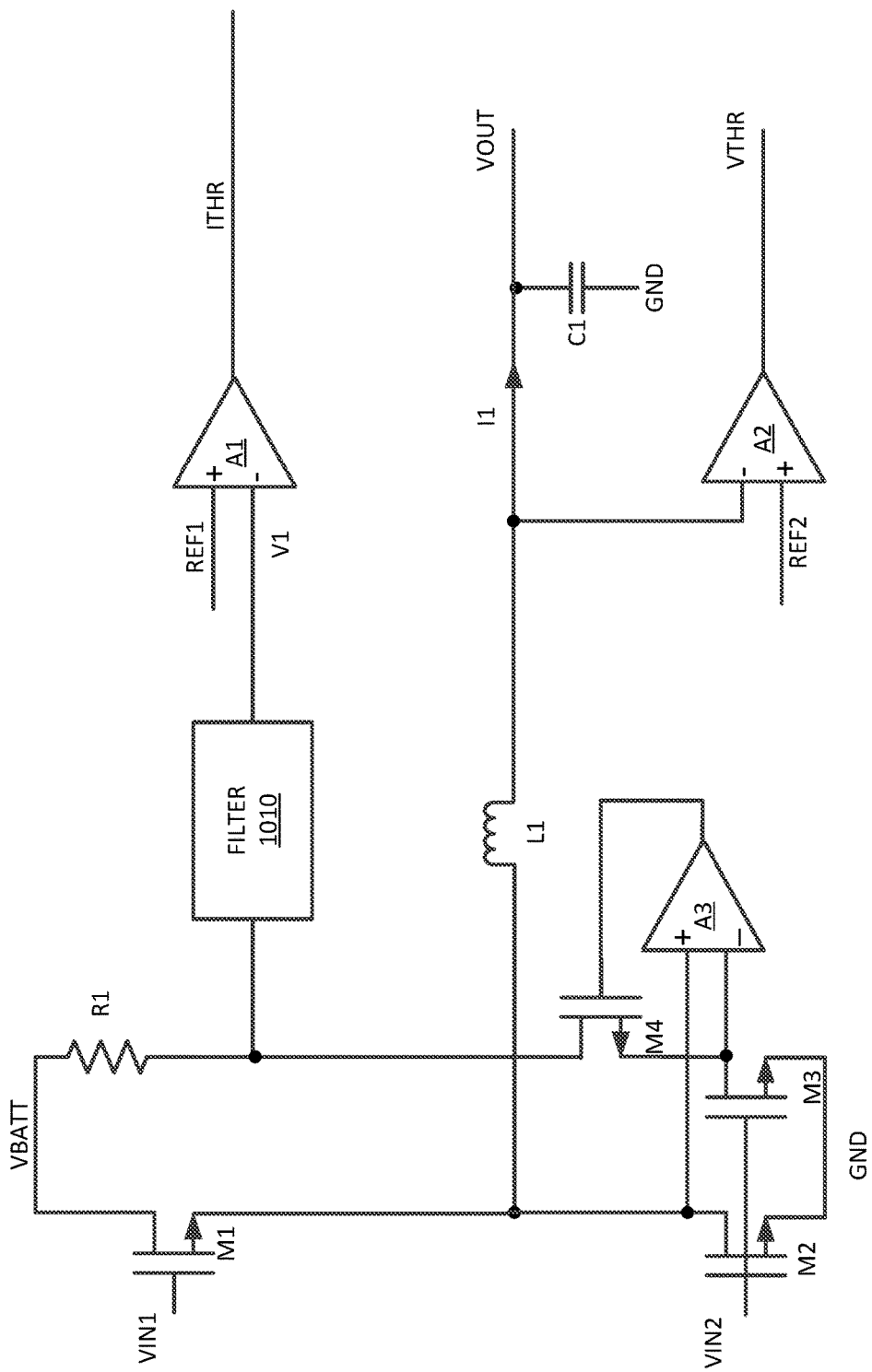
FIG. 10 illustrates a portion of a power management circuit according to an embodiment of the present invention.

FIG. 10 illustrates a portion of a power management circuit according to an embodiment of the present invention. In this example, transistors M1 and M2 may be an output stage of a buck converter or other type of switching power supply. The input signals VIN1 and VIN2 may be non-overlapping pulse-width modulated signals that generate current I1 through inductor L1 to provide the output power supply VOUT for a load, such as system-on-a-chip 120 shown in FIG. 1. Transistor M3 may have its gate and source coupled to the gate and source of transistor M2. Amplifier A3 may drive transistor M4 such that the voltage at the inverting input of the amplifier is equal to the drain voltage of M2. In this way, the operating conditions of M2 and M3 may match. The resulting current through R1 may be proportional to current I1. (Transistors M2 and M3 may be scaled to each other, for example by forming transistor M2 from multiple versions of transistor M3.) The resulting voltage across R1 may be filtered by filter 1010 and compared to a reference voltage REF1 using comparator or amplifier A1. When current I1 is above a current limit and excessive, comparator A1 may provide a low signal on ITHR. This low signal may be received by phase-locked loop 130 as shown in FIG. 1. This low signal may cause phase-locked loop 130 to reduce the frequency of the clock signal provided to system-on-a-chip 120. In turn, this reduction in frequency may reduce the current I1. In this example, a reduction in the current limit would mean that REF1 is increased in voltage.

Once the frequency of the clock signal provided by phase-locked loop 130 is reduced, the operating voltage required by system-on-a-chip 120 may be reduced. Accordingly, power management circuit 110 may include comparator A2. Comparator A2 may compare the power supply output voltage VOUT to a second reference voltage REF2. When the power supply output voltage VOUT falls below be REF2, comparator A2 may provide a low level for output signal VTHR. This low level may be received by phase-locked loop 130, which may further reduce the frequency of the clock signal provided by system-on-a-chip 120.

Figure 11:
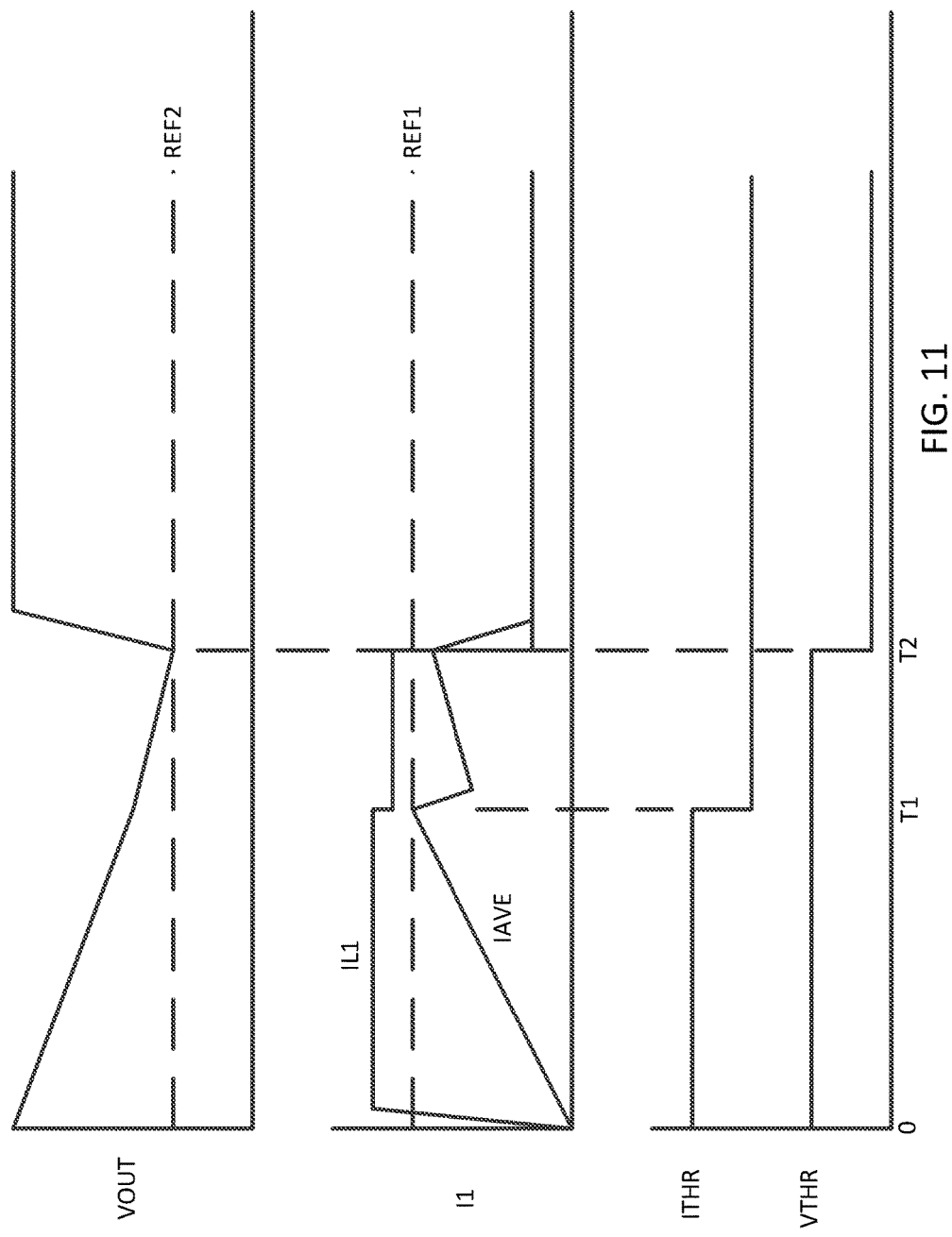
FIG. 11 is a timing diagram of a power management circuit according to an embodiment of the present invention.

FIG. 11 is a timing diagram of a power management circuit according to an embodiment of the present invention. In this example, I1 may increase, thereby causing the average current to increase until it reaches a reference voltage REF1 at time T1. At this time, comparator A1 may change state, and ITHR may go low. This may reduce a clock frequency by a specific percent. In this example, the average of current I1 may continue to increase. This may in turn cause the output voltage VOUT to reach a second reference voltage REF2. As this occurs, comparator A2 (shown in FIG. 10) may drive output signal VTHR low, which may reduce the clock frequency even further. This may reduce I1 and allow VOUT to return to a higher level.

Figure 12:
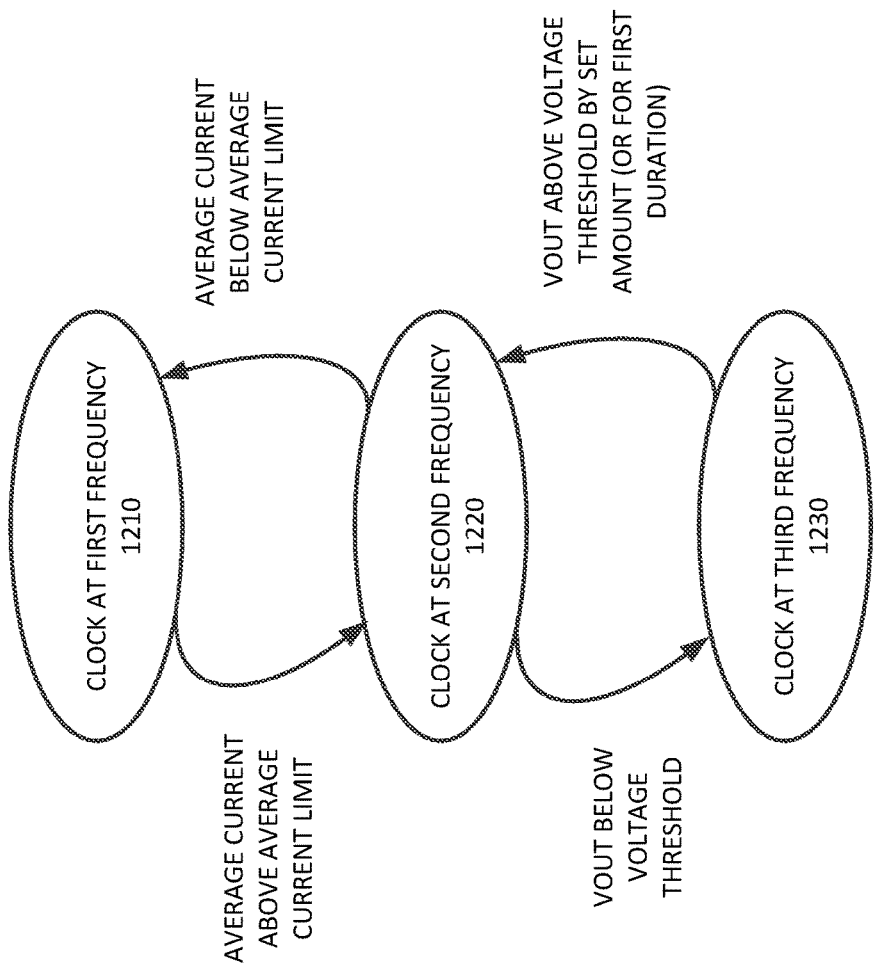
FIG. 12 is a state diagram showing the operation of a power management circuit according to an embodiment of the present invention.

FIG. 12 is a state diagram showing the operation of a power management circuit according to an embodiment of the present invention. Initially, a power management circuit may be in state 1210 with the clock at the first or initial frequency. When the average current exceeds the average current limit, the power management circuit may enter state 1220. At this time, the clock may be reduced to a first reduced frequency. The power management circuit may return to state 1210 when the average current falls below the average current limit. From state 1220, the power management circuit may go to state 1230 when the output voltage falls below a voltage threshold. In state 1230, the clock may be reduced further to a second reduced frequency. The power management circuit may return to state 1220 when the output is above the voltage threshold, for example by a set amount, for a first duration, or when another condition or combination of conditions are met.

Figure 13:
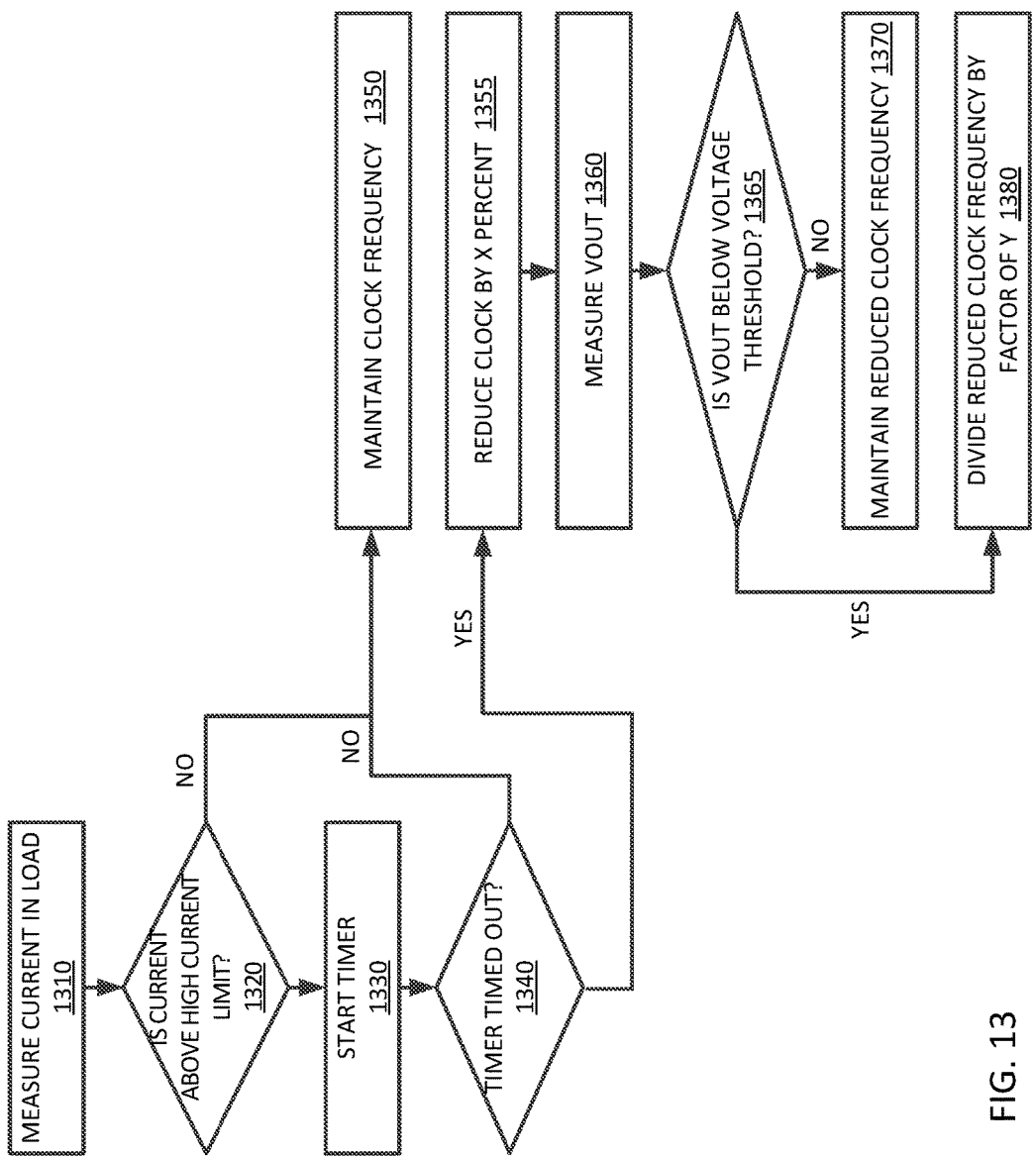
FIG. 13 is a flowchart of a method of managing power according to an embodiment of the present invention.

FIG. 13 is a flowchart of a method of managing power according to an embodiment of the present invention. In act 1310, a load current, for example a current through a power supply inductor, such as inductor L1 in FIG. 1, may be measured. In act 1320, it may be determined whether this current is above a high current limit. If the measured current is not above the high current limit, the clock frequency may be maintained at an initial frequency in act 1350. If the current is above the high current limit, then a timer is started in act 1330. If the timer times out in act 1340, then the clock frequency may be reduced by X percent in act 1355. Again, X may be 10, 20, 30, 40, 50, 75, 80 percent or other percentage or range of percentages. At this time, the current limit may be reduced as well from the high current limit to a low current limit.

Once this clock frequency has been reduced to a first reduced frequency, the power supply output voltage VOUT may be measured in act 1360 and compared to a voltage threshold in act 1365. If the output is above this voltage threshold, the clock frequency may be maintained in act 1370. If the power supply output voltage falls below the voltage threshold, then the clock frequency may be divided by a factor of Y in act 1380 to a second reduced frequency. Again, the factor Y may be a factor of less than two, two, three, four, five, more than five, or other factor.

In these and other embodiments of the present invention, the low frequency clock states may be exited in various ways. For example, the clock frequency may be increased from the second (lowest) reduced frequency to the first reduced frequency when the output voltage is above the voltage threshold by a specific margin (which may be determined using a hysteresis comparator), when the output voltage is above the voltage threshold for a second duration, or when another condition or combination of conditions is met. The clock frequency may be increased from the first reduced frequency to the initial frequency when the drawn current is below the low current limit, the current is below the low current limit for a second duration, or when other condition or conditions are met. A simplified circuit that may be used in implementing this flowchart is shown in the following figure.

Figure 14:
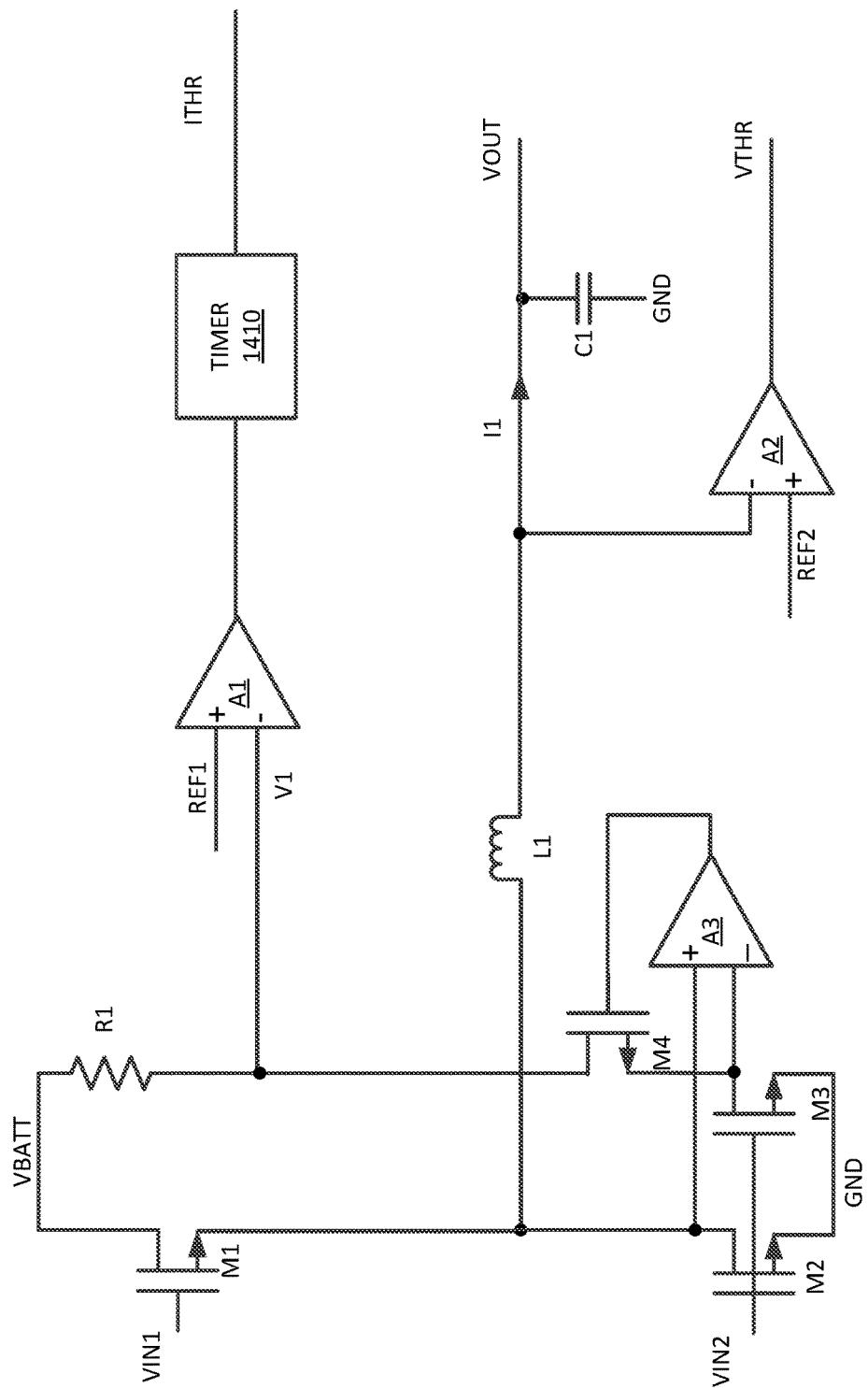
FIG. 14 illustrates a portion of a power management circuit according to an embodiment of the present invention.

FIG. 14 illustrates a portion of a power management circuit according to an embodiment of the present invention. In this example, transistors M1 and M2 may be an output stage of a buck converter or other type of switching power supply. The input signals VIN1 and VIN2 may be non-overlapping pulse-width modulated signals that generate current I1 through inductor L1 to provide the output power supply VOUT for a load, such as system-on-a-chip 120 shown in FIG. 1. Transistor M3 may have its gate and source coupled to the gate and source of transistor M2 to form a current mirror. Amplifier A3 may drive transistor M4 such that the voltage at the inverting input of the amplifier is equal to the drain voltage of M2. In this way, the operating conditions of M2 and M3 may match. The resulting current through R1 may be proportional to current I1. (Transistors M2 and M3 may be scaled to each other, for example by forming transistor M2 from multiple versions of transistor M3.) The resulting voltage across R1 may be compared to a reference voltage REF1 using comparator or amplifier A1. When current I1 is above a current limit and excessive, comparator A1 may start timer 1410. When timer 1410 times out, it may provide a low signal on ITHR. This low signal may be received by phase-locked loop 130 as shown in FIG. 1. This low signal may cause phase-locked loop 130 to reduce the frequency of the clock signal provided to system-on-a-chip 120. In turn, this reduction in frequency may reduce the current I1. Again, the current limit may be reduced as well. In this example, a reduction in the current limit would mean that REF1 is increased in voltage.

Once the frequency of the clock signal provided by phase-locked loop 130 is reduced, the operating voltage required by system-on-a-chip 120 may be reduced. Accordingly, power management circuit 110 may include comparator A2. Comparator A2 may compare the power supply output voltage VOUT to a second reference voltage REF2. When the power supply output voltage VOUT falls below be REF2, comparator A2 may provide a low level on output signal VTHR. This low level may be received by phase-locked loop 130, which may further reduce the frequency of the clock signal provided by system-on-a-chip 120.

Figure 15:
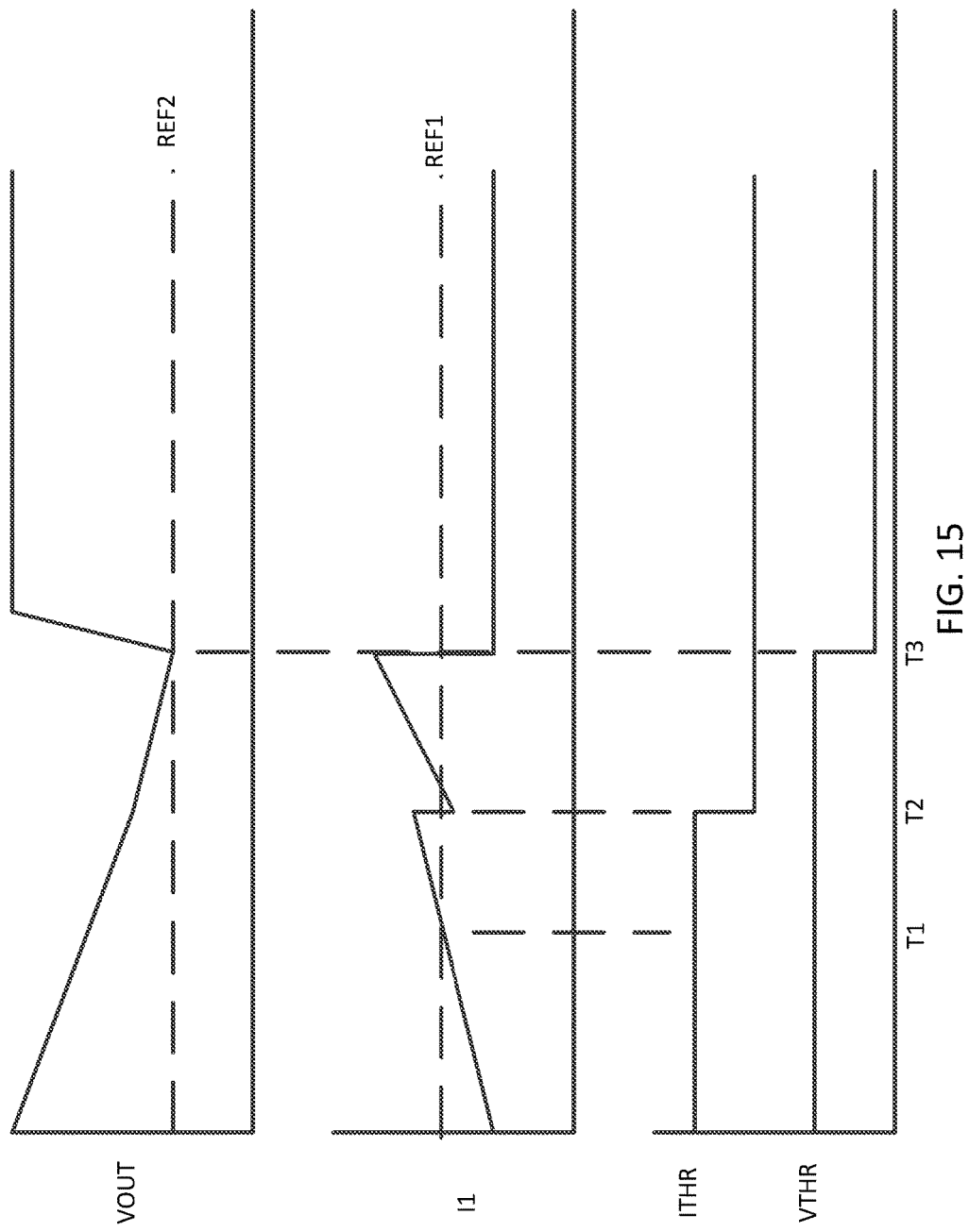
FIG. 15 is a timing diagram of a power management circuit according to an embodiment of the present invention.

FIG. 15 is a timing diagram of a power management circuit according to an embodiment of the present invention. In this example, I1 may increase progressively until it reaches a reference voltage REF1 at time T1. At this time, comparator A1 (shown in FIG. 14) may change state, and may start timer 1410. After timer 1410 times out, ITHR may go low at time T2. This may reduce a clock frequency by a specific percent. In this example, the output current I1 may continue to increase. This may in turn cause the output voltage VOUT to reach a second reference voltage REF2. As this occurs, comparator A2 (shown in FIG. 14) may drive output signal VTHR low, which may reduce the clock frequency even further. This may reduce I1 and allow VOUT to return to a higher level.

Figure 16:
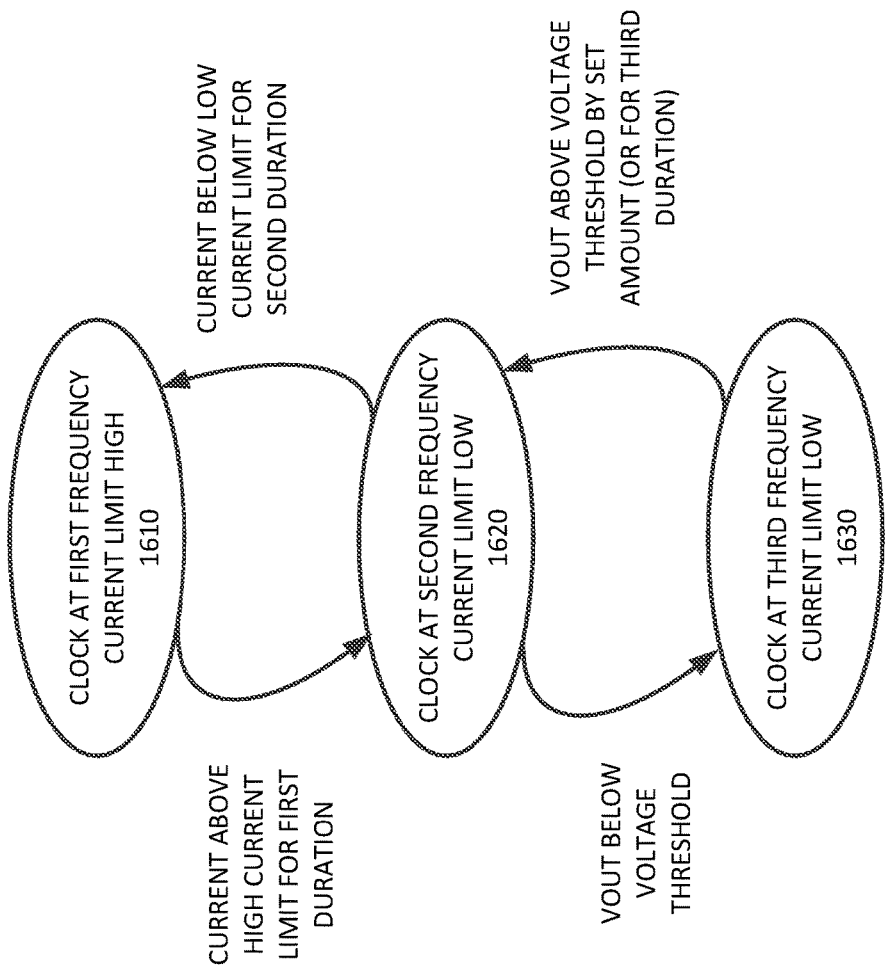
FIG. 16 is a state diagram showing the operation of a power management circuit according to an embodiment of the present invention.

FIG. 16 is a state diagram showing the operation of a power management circuit according to an embodiment of the present invention. Initially, a power management circuit may be in state 1610 with the clock at the first or initial frequency and the current at a high current limit. When the current exceeds the high current limit for a first duration, the power management circuit may enter state 1620. At this time, the clock may be reduced to a first reduced frequency and the current limit may be set to a low current limit. The power management circuit may return to state 1610 when the current falls below the low current limit, when the current falls below the low current limit for a second duration, or when another condition or combination of conditions are met. From state 1620, the power management circuit may go to state 1630 when the output voltage falls below a voltage threshold. In state 1630, the clock may be reduced further to a second reduced frequency and the current limit may remain at the low current limit. The power management circuit may return to state 1620 when the output is above the voltage threshold, for example by a set amount, for a third duration, or when another condition or combination of conditions are met.

Figure 17:
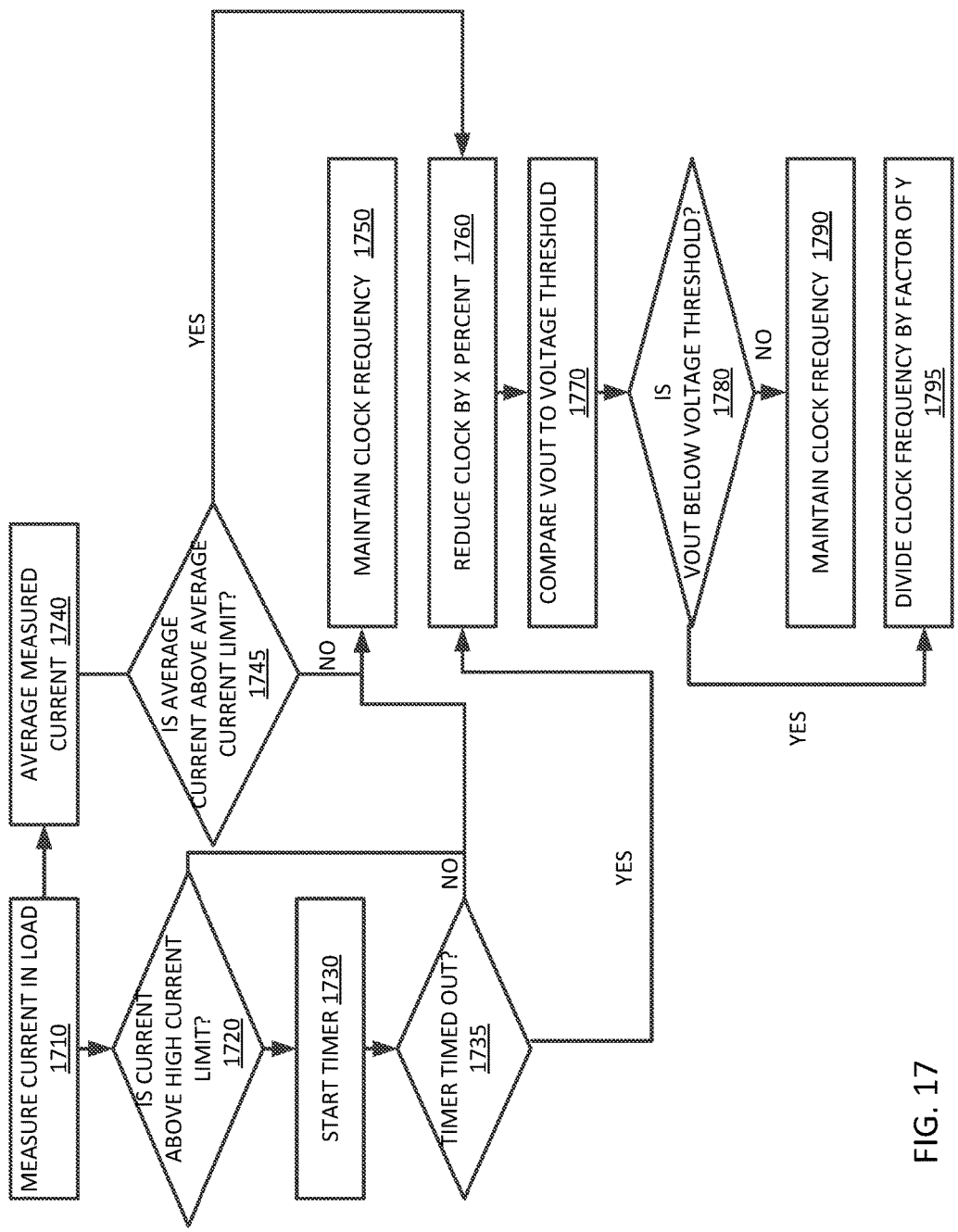
FIG. 17 is a flowchart of a method of managing power according to an embodiment of the present invention.

FIG. 17 is a flowchart of a method of managing power according to an embodiment of the present invention. In act 1710, a load current, for example a current through a power supply inductor, such as inductor L1 in FIG. 1, may be measured. In act 1720, it may be determined whether this current is above a high current limit. If the measured current is not above the high current limit, the clock frequency may be maintained at an initial frequency in act 1750. If the current is above the high current limit, a timer may be started in act 1730. If the timer times out in act 1430, then the clock frequency may be reduced by X percent in act 1760. Again, X may be 10, 20, 30, 40, 50, 75, 80 percent or other percentage or range of percentages. At this time, the current limit may be reduced as well. In parallel, the measured current may also be filtered or otherwise averaged in act 1740. The filtered or average current may be compared to an average current limit in act 1745. If the average current limit is exceeded, the clock frequency may be reduced, again in act 1760.

Once this clock frequency has been reduced to a first reduced frequency, the power supply output voltage VOUT may be measured in act 1770 and compared to a voltage threshold in act 1780. If the output is above this voltage threshold, the clock frequency may be maintained in act 1790. If the power supply output voltage falls below the voltage threshold, then the clock frequency may be divided by a factor of Y in act 1795 to a second reduced frequency. Again, the factor Y may be a factor of less than two, two, three, four, five, more than five, or other factor.

In these and other embodiments of the present invention, the low frequency clock states may be exited in various ways. For example, the clock frequency may be increased from the second reduced frequency to the first reduced frequency when the output voltage is above the voltage threshold by a specific margin, when the output voltage is above the voltage threshold for a second duration, or when another condition or combination of conditions is met. The clock frequency may be increased from the first reduced frequency to the initial frequency when the load current is below the low current limit for a third duration and when the average current is below the average current limit. A simplified circuit that may be used in implementing this flowchart is shown in the following figure.

Figure 18:
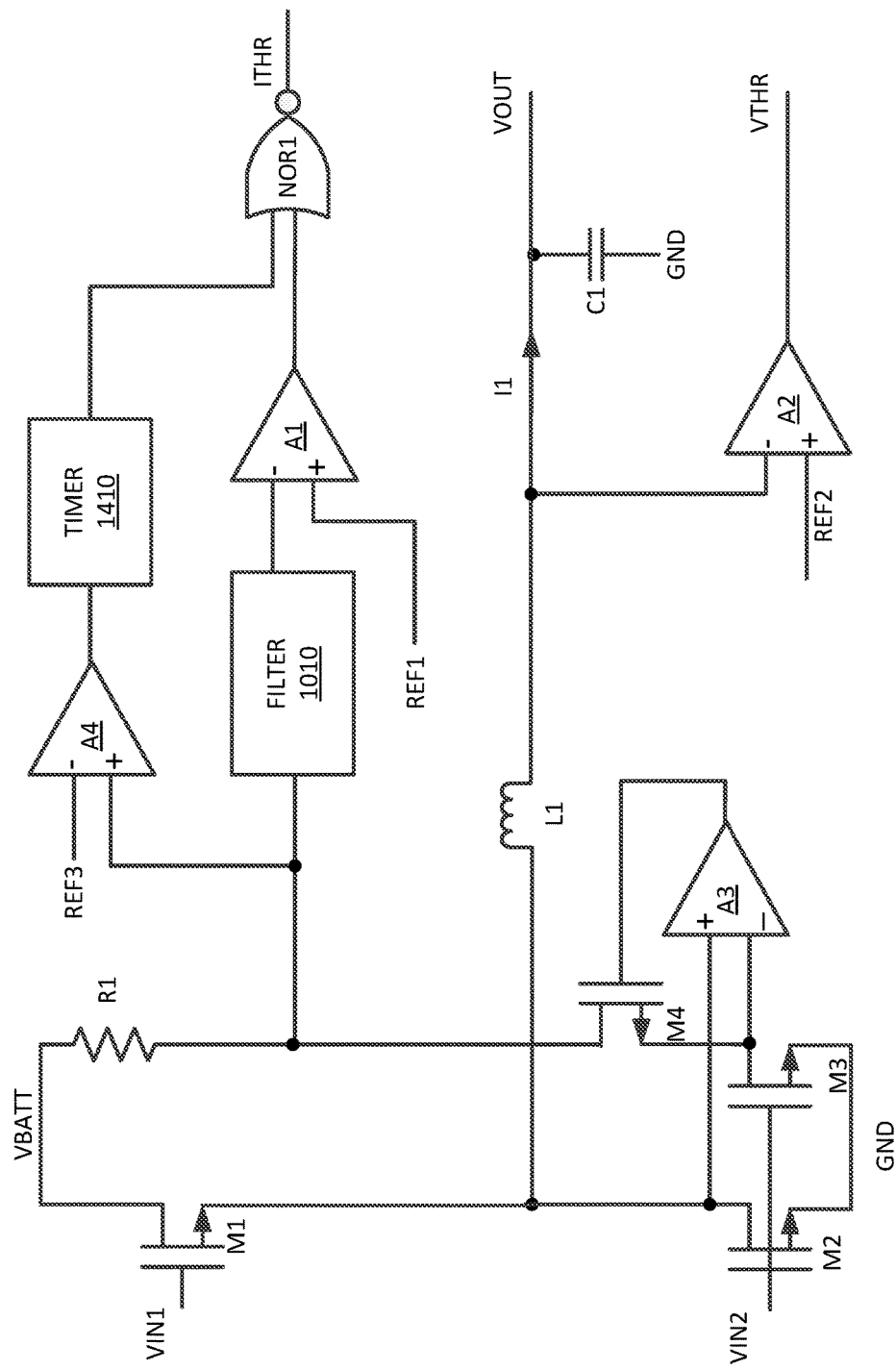
FIG. 18 illustrates a portion of a power management circuit according to an embodiment of the present invention.

FIG. 18 illustrates a portion of a power management circuit according to an embodiment of the present invention. In this example, transistors M1 and M2 may be an output stage of a buck converter or other type of switching power supply. The input signals VIN1 and VIN2 may be non-overlapping pulse-width modulated signals that generate current I1 through inductor L1 to provide the output power supply VOUT for a load, such as system-on-a-chip 120 shown in FIG. 1. Transistor M3 may have its gate and source coupled to the gate and source of transistor M2 to form a current mirror. Amplifier A3 may drive transistor M4 such that the voltage at the inverting input of the amplifier is equal to the drain voltage of M2. In this way, the operating conditions of M2 and M3 may match. The resulting current through R1 may be proportional to current I1. (Transistors M2 and M3 may be scaled to each other, for example by forming transistor M2 from multiple versions of transistor M3.) The resulting voltage across R1 may be filtered by filter 1010 and the average current compared to a reference voltage REF1 using comparator or amplifier A1. When the average current is above a current limit and excessive, comparator A1 may provide a low signal to the gate NOR1. This low signal may cause ITHR to go low and be received by phase-locked loop 130 as shown in FIG. 1. This low signal may cause phase-locked loop 130 to reduce the frequency of the clock signal provided to system-on-a-chip 120. In turn, this reduction in frequency may reduce the current I1. The unfiltered current output across R1 may be compared to comparator A3, which may drive timer 1410. When timer 1410 times out, it may drive the output ITHR low.

Once the frequency of the clock signal provided by phase-locked loop 130 is reduced, the operating voltage required by system-on-a-chip 120 may be reduced. Accordingly, power management circuit 110 may include comparator A2. Comparator A2 may compare the power supply output voltage VOUT to a second reference voltage REF2. When the power supply output voltage VOUT falls below be REF2, comparator A2 may provide a low level on output signal VTHR. This low level may be received by phase-locked loop 130, which may further reduce the frequency of the clock signal provided by system-on-a-chip 120.

Figure 19:
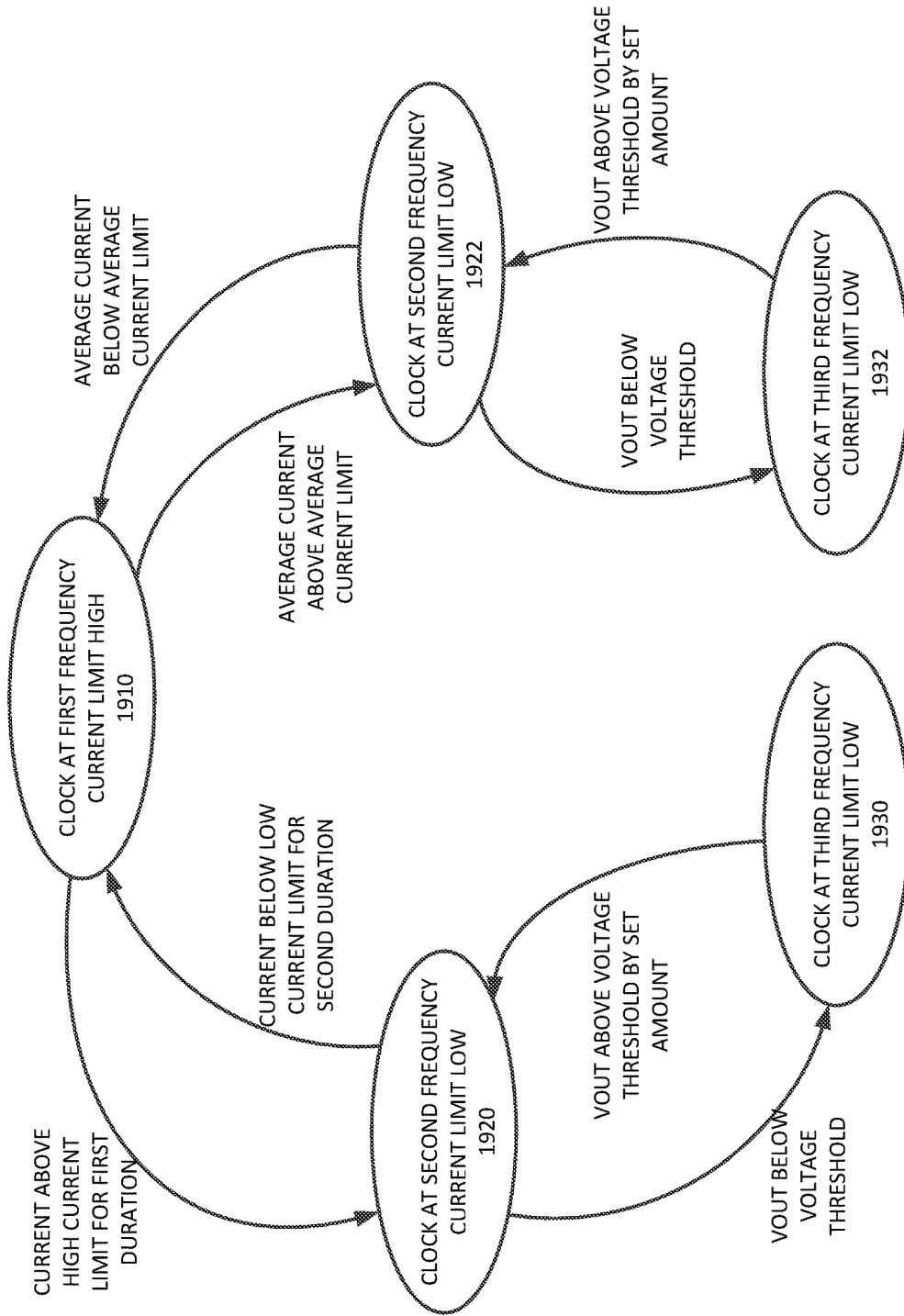
FIG. 19 is a state diagram showing the operation of a power management circuit according to an embodiment of the present invention.

FIG. 19 is a state diagram showing the operation of a power management circuit according to an embodiment of the present invention. Initially, a power management circuit may be in state 1910 with the clock at the first or initial frequency and the current at a high current limit. When the current exceeds the high current limit for a first duration, the power management circuit may enter state 1920. At this time, the clock may be reduced to a first reduced frequency and the current limit may be set to a low current limit. The power management circuit may return to state 1910 when the current falls below the low current limit, when the current falls below the low current limit for a second duration, or when another condition or combination of conditions are met. From state 1920, the power management circuit may go to state 1930 when the output voltage falls below a voltage threshold. In state 1930, the clock may be reduced further to a second reduced frequency and the current limit may remain at the low current limit. The power management circuit may return to state 1920 when the output is above the voltage threshold, for example by a set amount, for a first duration, or when another condition or combination of conditions are met.

Similarly, the power management circuit may be in state 1910 with the clock at the first or initial frequency. When the average current exceeds the average current limit, the power management circuit may enter state 1922. At this time, the clock may be reduced to a first reduced frequency. The power management circuit may return to state 1910 when the average current falls below the average current limit. From state 1920, the power management circuit may go to state 1932 when the output voltage falls below a voltage threshold. In state 1932, the clock may be reduced further to a second reduced frequency. The power management circuit may return to state 1922 when the output is above the voltage threshold, for example by a set amount, for a first duration, or when another condition or combination of conditions are met.

Figure 20:
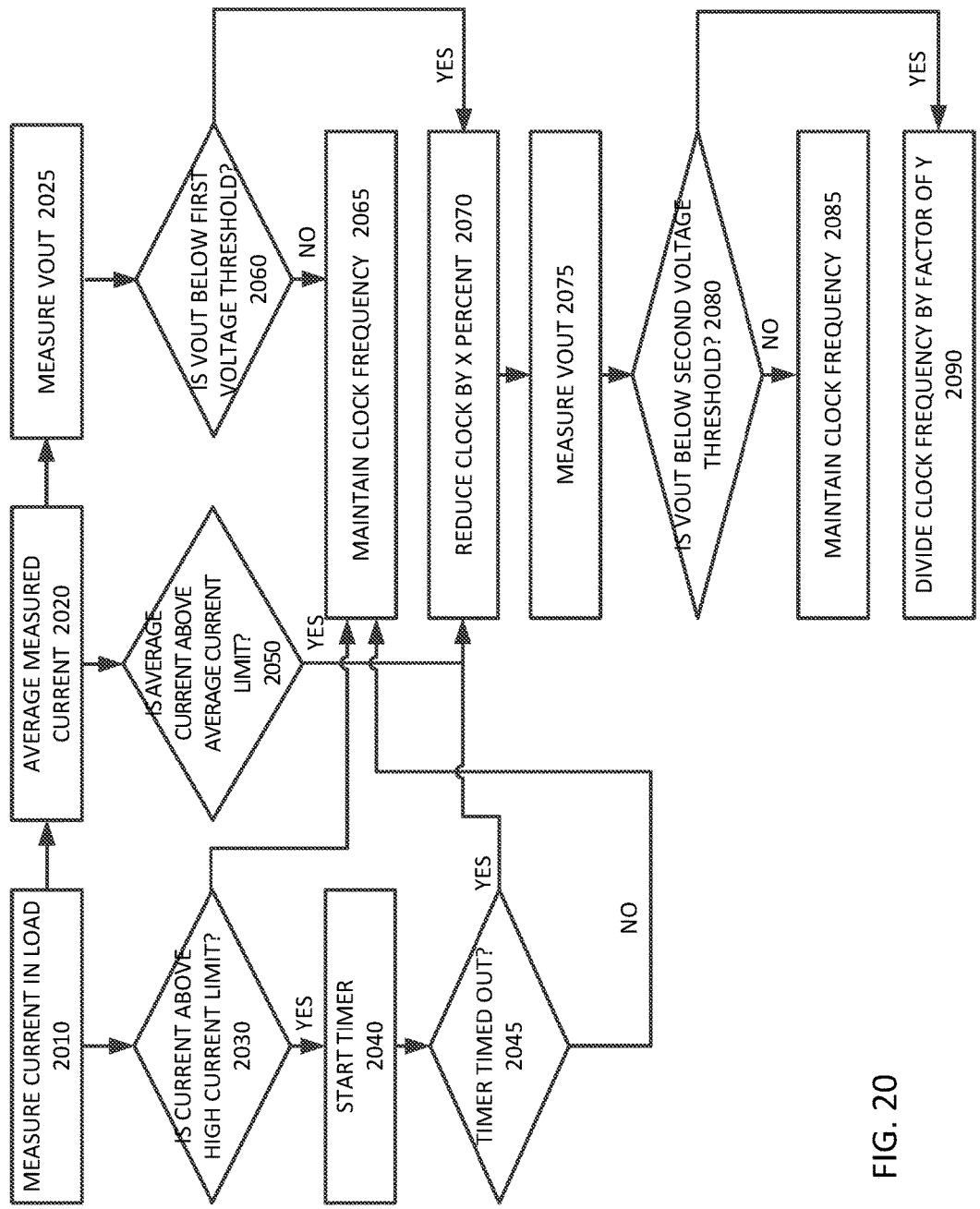
FIG. 20 is another flowchart of a method of managing power according to an embodiment of the present invention.

FIG. 20 is another flowchart of a method of managing power according to an embodiment of the present invention. This example may be substantially similar to that in FIG. 14. In this specific example, the clock frequency may be additionally reduced when VOUT falls below a first voltage threshold.

Figure 21:
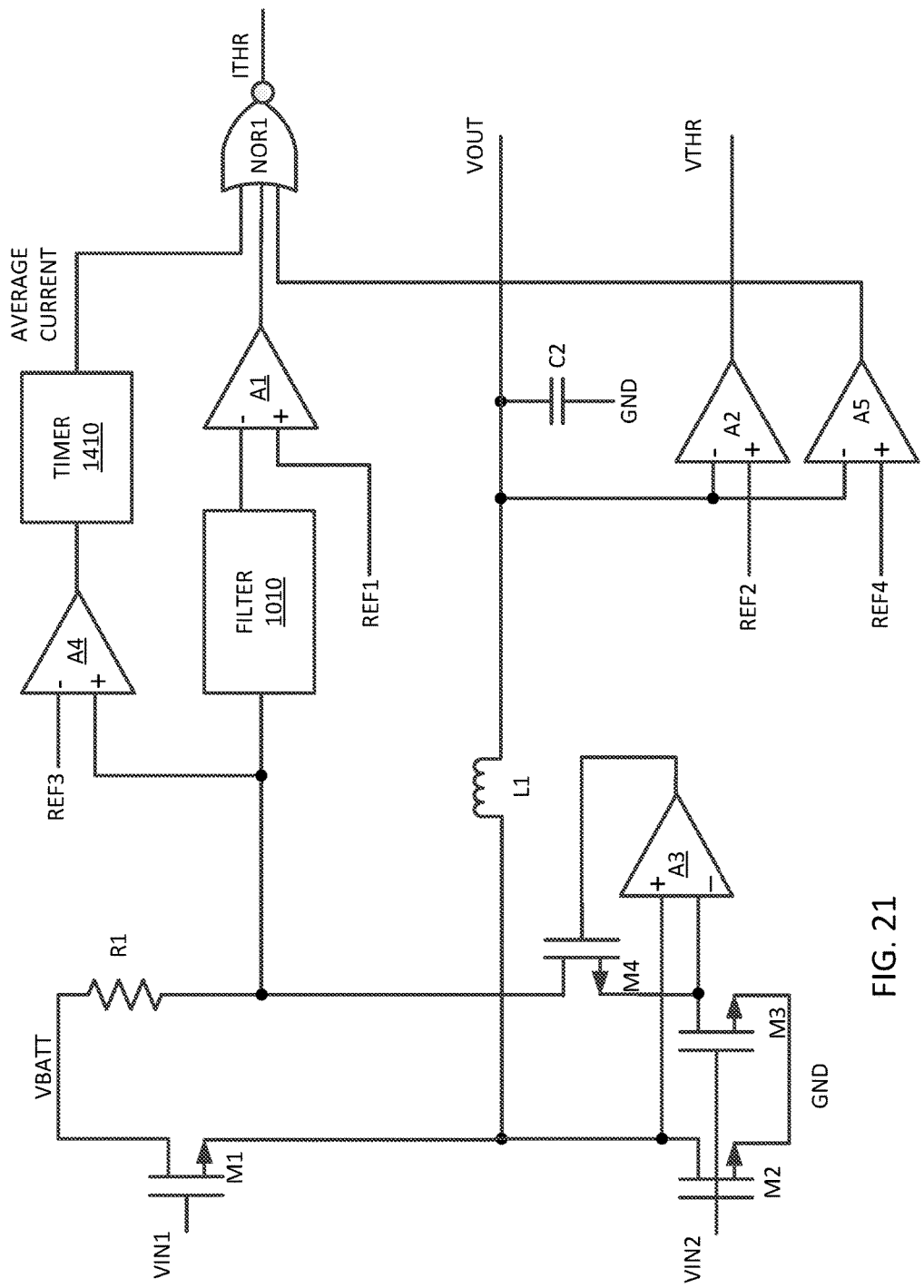
FIG. 21 illustrates a portion of a power management circuit according to an embodiment of the present invention.

FIG. 21 illustrates a portion of a power management circuit according to an embodiment of the present invention. In this example, an additional comparator A5 may compare VOUT to a reference voltage REF4. When VOUT falls below REF4, the output ITHR of NOR1 will go low, again reducing the phase-locked loop frequency.

Figure 22:
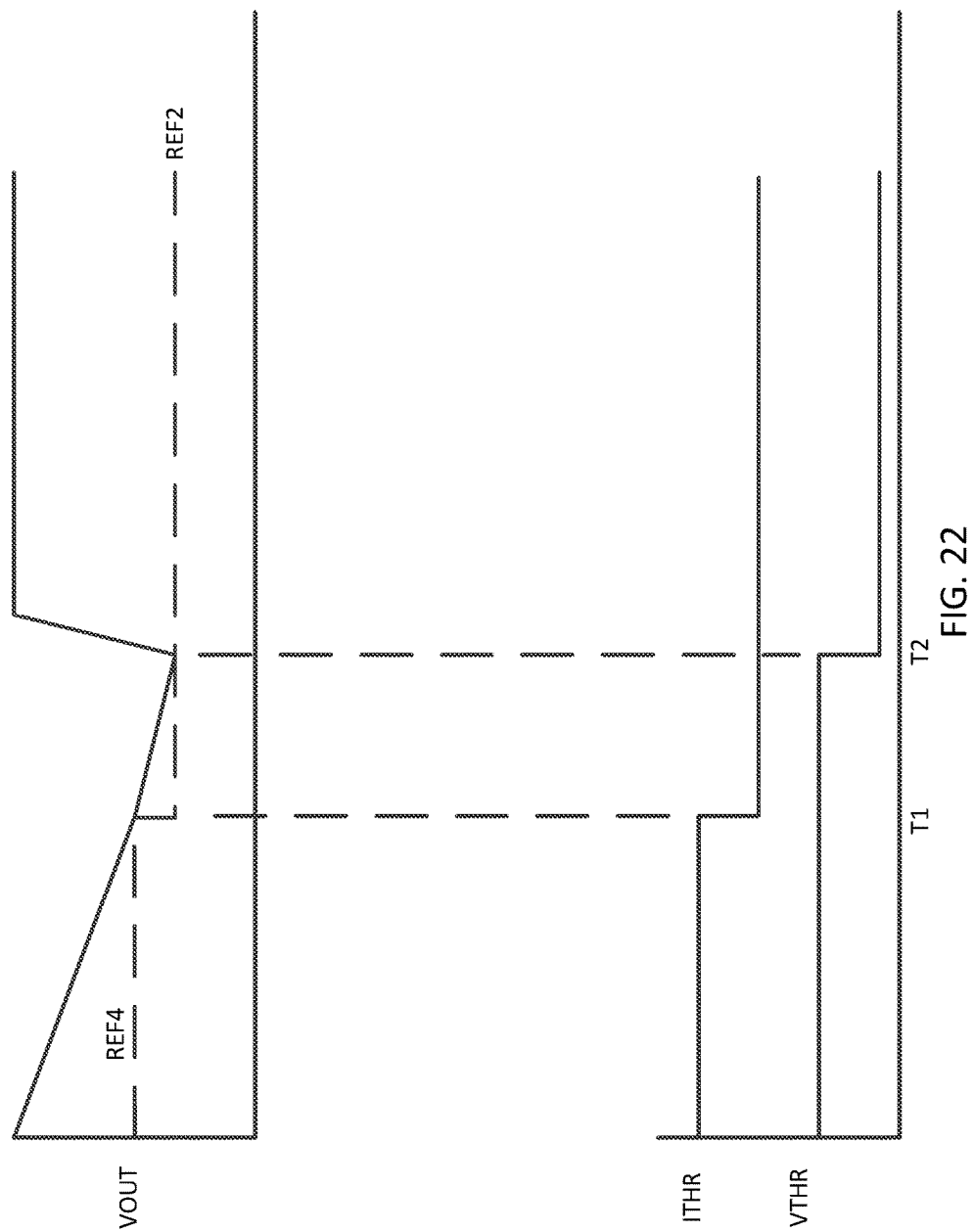
FIG. 22 is a timing diagram of a power management circuit according to an embodiment of the present invention.

FIG. 22 is a timing diagram of a power management circuit according to an embodiment of the present invention. In this example, VOUT falls below REF4 at time T1, causing ITHR to go low. This may reduce a clock frequency by a specific percent. VOUT may continue to fall to REF2 at time T2, causing VTHR to fall, whereby the clock frequency may be further reduced.

Figure 23:
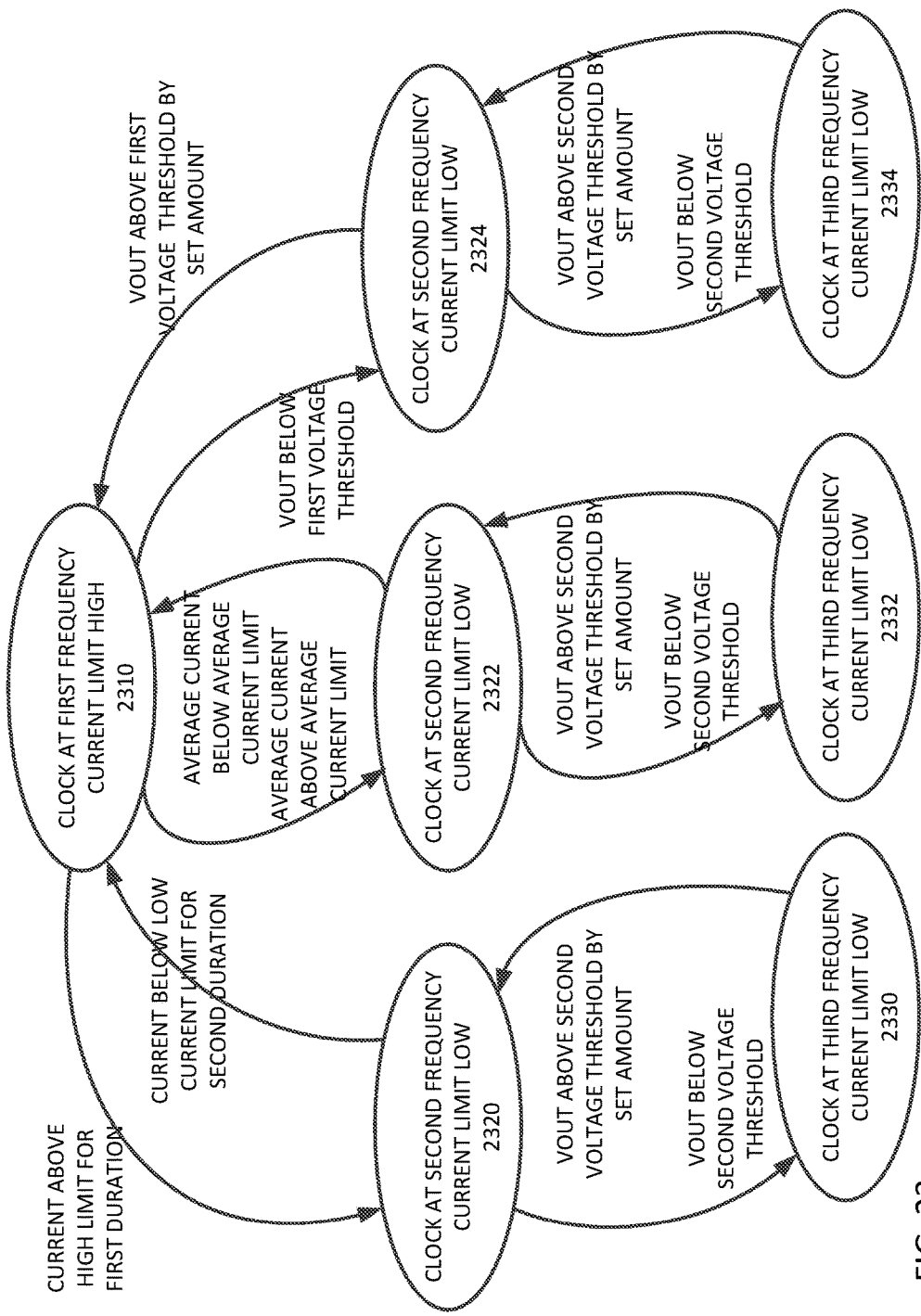
FIG. 23 is a state diagram showing the operation of a power management circuit according to an embodiment of the present invention.

FIG. 23 is a state diagram showing the operation of a power management circuit according to an embodiment of the present invention. In this example, a power management circuit initially at state 2310 may move to state 2324 when the output voltage falls below a first voltage threshold. The power management circuit may return to state 2310 when the output voltage is above the first voltage threshold, for example by a set amount, for a first duration, or when another condition or combination of conditions are met. The remainder of this state diagram may correspond to the state diagram shown in FIG. 19.

In the above examples, an initial clock frequency may be a high frequency and the clock frequency may be reduced due to excess current and low voltage conditions. In these and other embodiments of the present invention, an initial clock frequency may be increased due to various conditions. For example, a circuit may be operable in a low-power configuration that may allow an increase in clock frequency from an initial frequency.

Embodiments of the present invention may provide power management circuits that may be located in various types of devices, such as portable computing devices, tablet computers, desktop computers, laptops, all-in-one computers, wearable computing devices, cellular phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of operating a power management circuit, the method comprising:
providing a first clock having a first frequency to a first load circuit;
measuring a first current provided into a load by the power management circuit, the load including the first load circuit;
comparing the first current to a high current limit;
if the first current is greater than the high current limit for a first duration, then reducing the frequency of the first clock to a second frequency, otherwise not reducing the frequency of the first clock; and
averaging the first current;
comparing the averaged first current to an average current limit;
if the averaged first current is greater than the average current limit, then reducing the frequency of the first clock to the second frequency, otherwise not reducing the frequency of the first clock;
if the frequency of the first clock is reduced to the second frequency, then
comparing an output voltage provided to the load to a voltage threshold, and if the output voltage is below the voltage threshold, then further reducing the frequency of the first clock to a third frequency, otherwise not further reducing the frequency of the first clock.

2. The method of claim 1 further comprising:
when the frequency of the first clock is reduced to the third frequency, comparing the output voltage to the voltage threshold, and if the output voltage is higher than the voltage threshold for a second duration, then increasing the frequency of the first clock to the second frequency, otherwise not increasing the frequency of the first clock.

3. The method of claim 1 further comprising:
when the frequency of the first clock is reduced to the third frequency, comparing the output voltage to the voltage threshold, and if the output voltage is higher than the voltage threshold by a first amount, then increasing the frequency of the first clock to the second frequency, otherwise not increasing the frequency of the first clock.

4. The method of claim 2 further comprising:
when the frequency of the first clock is at the second frequency, lowering the high current limit to a low current limit; and
if the first current is below the low current limit for a third duration, and the average current is less than the average current limit, then increasing the frequency of the first clock to the first frequency, otherwise not increasing the frequency of the first clock.

5. The method of claim 3 further comprising:
when the frequency of the first clock is at the second frequency, lowering the high current limit to a low current limit; and if the first current is below the low current limit for a third duration, and the average current is less than the average current limit, then increasing the frequency of the first clock to the first frequency, otherwise not increasing the frequency of the first clock.

6. The method of claim 1 wherein the first current into the load is measured using a current mirror to generate a second current proportional to the first current.

7. The method of claim 1 wherein the averaging is done with a time constant of between 10 and 100 us.

8. A method of operating a power management circuit, the method comprising:
providing a first clock having a first frequency to a first load circuit;
measuring a first current provided into a load by the power management circuit, the load including the first load circuit;
comparing the first current to a high current limit;
if the first current is greater than the high current limit for a first duration, then reducing the frequency of the first clock to a second frequency, otherwise not reducing the frequency of the first clock; and
if the frequency of the first clock is reduced to the second frequency, then
comparing an output voltage provided to the load to a voltage threshold, and if the output voltage is below the voltage threshold, then further reducing the frequency of the first clock to a third frequency, otherwise not further reducing the frequency of the first clock.

9. The method of claim 8 further comprising:
when the frequency of the first clock is reduced to the third frequency,
comparing the output voltage to the voltage threshold, and if the output voltage is higher than the voltage threshold for a second duration, then increasing the frequency of the first clock to the second frequency, otherwise not increasing the frequency of the first clock.

10. The method of claim 8 further comprising:
when the frequency of the first clock is reduced to the third frequency,
comparing the output voltage to the voltage threshold, and if the output voltage is higher than the voltage threshold by a first amount, then increasing the frequency of the first clock to the second frequency, otherwise not increasing the frequency of the first clock.

11. The method of claim 9 further comprising:
when the frequency of the first clock is reduced to the second frequency,
lowering the high current limit to a low current limit; and
if the first current is below the low current limit for a third duration, then increasing the frequency of the first clock to the first frequency, otherwise not increasing the frequency of the first clock.

12. The method of claim 10 further comprising:
when the frequency of the first clock is reduced to the second frequency,
lowering the high current limit to a low current limit; and
if the first current is below the low current limit for a third duration, then increasing the frequency of the first clock to the first frequency, otherwise not increasing the frequency of the first clock.

13. The method of claim 8 wherein the first current into the load is measured using a current mirror to generate a second current proportional to the first current.

14. The method of claim 13 wherein the second current is converted to a voltage and provided to a comparator.

15. A method of operating a power management circuit, the method comprising:
providing a first clock having a first frequency to a first load circuit;
measuring a first current provided into a load by the power management circuit, the load including the first load circuit;
averaging the measured first current;
comparing the averaged first current to an average current limit;
if the averaged first current is greater than the average current limit, then reducing the frequency of the first clock to a second frequency, otherwise not reducing the frequency of the first clock;
if the frequency of the first clock is reduced to the second frequency, then
comparing an output voltage provided to the load to a voltage threshold, and if the output voltage is below the voltage threshold, then further reducing the frequency of the first clock to a third frequency, otherwise not further reducing the frequency of the first clock.

16. The method of claim 15 further comprising:
when the frequency of the first clock is reduced to the third frequency, comparing the output voltage to the voltage threshold, and if the output voltage is higher than the voltage threshold for a first duration, then increasing the frequency of the first clock to the second frequency, otherwise not increasing the frequency of the first clock.

17. The method of claim 15 further comprising:
when the frequency of the first clock is reduced to the third frequency, comparing the output voltage to the voltage threshold, and if the output voltage is higher than the voltage threshold by a first amount, then increasing the frequency of the first clock to the second frequency, otherwise not increasing the frequency of the first clock.

18. The method of claim 16 further comprising:
when the frequency of the first clock is at the second frequency, if the average current is less than the average current limit, then increasing the frequency of the first clock to the first frequency, otherwise not increasing the frequency of the first clock.

19. The method of claim 17 further comprising:
when the frequency of the first clock is at the second frequency, if the average current is less than the average current limit, then increasing the frequency of the first clock to the first frequency, otherwise not increasing the frequency of the first clock.

20. The method of claim 15 wherein the first current into the load is measured using a current mirror to generate a second current proportional to the first current.

* * * * *